(12) United States Patent
Nakatani et al.

(10) Patent No.: US 7,298,205 B2
(45) Date of Patent: Nov. 20, 2007

(54) AMPLIFIER AND FREQUENCY CONVERTER

(75) Inventors: Toshifumi Nakatani, Sakai (JP); Jyunji Itoh, Hirakata (JP); Hideo Nakano, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 52 days.

(21) Appl. No.: 10/945,987

(22) Filed: Sep. 22, 2004

(65) Prior Publication Data

US 2005/0062540 A1    Mar. 24, 2005

(51) Int. Cl.
H03F 3/213 (2006.01)
H03F 1/34 (2006.01)
H04B 1/10 (2006.01)

(52) U.S. Cl. .................. 330/107; 330/294; 455/254

(58) Field of Classification Search .............. 330/98, 330/99, 100, 103, 107, 109, 84, 294, 311, 330/295; 455/254
See application file for complete search history.

(56) References Cited

U.S. PATENT DOCUMENTS

| | | | |
|---|---|---|---|
| 4,118,731 A | 10/1978 | Hinn | |
| 4,706,038 A * | 11/1987 | Navidi et al. | 330/271 |
| 5,015,968 A * | 5/1991 | Podell et al. | 330/277 |
| 6,204,728 B1 * | 3/2001 | Hageraats | 330/98 |
| 6,255,889 B1 * | 7/2001 | Branson | 327/359 |
| 6,498,535 B1 | 12/2002 | Allen et al. | |
| 7,057,457 B2 | 6/2006 | Irvine et al. | |
| 2005/0110555 A1 * | 5/2005 | Nakatani et al. | 327/359 |
| 2005/0270094 A1 * | 12/2005 | Nakatani | 330/107 |

FOREIGN PATENT DOCUMENTS

| | | |
|---|---|---|
| JP | 6-216670 | 8/1994 |
| JP | 7-94954 | 4/1995 |
| JP | 10-22751 | 1/1998 |
| JP | 10-335954 | 12/1998 |
| JP | 11-500276 | 1/1999 |
| JP | 2002-536859 | 10/2002 |
| WO | 96/25791 | 8/1996 |
| WO | 00/45505 | 8/2000 |

OTHER PUBLICATIONS

Sedra/Smith "Microelectronic Circuits" Fifth Edition, 2004, pp. 688 and 689.*

(Continued)

*Primary Examiner*—Evan Pert
(74) *Attorney, Agent, or Firm*—Wenderoth, Lind & Ponack, L.L.P.

(57) ABSTRACT

An amplifier circuit amplifies a signal inputted from an input terminal. A first feedback circuit is placed across an emitter of a bipolar transistor and an input of the amplifier circuit. A second feedback circuit is placed across the input and an output of the amplifier circuit for feeding the output of the amplifier circuit back to the input of the amplifier circuit. A phase change amount in the feedback circuit is determined by the values of an inductor and a capacitor. The values of these elements are selected so that a phase of a signal in which fundamental waves included in two feedback signals are combined and a phase of a signal in which second harmonics included in the two feedback signals are combined are shifted by approximately 180 degrees from a phase of a fundamental wave of an input signal.

7 Claims, 19 Drawing Sheets

OTHER PUBLICATIONS

C. Durdodt et al., Institute of Electrical and Electronics Engineers: "The First Very Low-IF RX, 2-Point Modulation TX CMOS System On Chip Bluetooth Solution", 2001 IEEE Radio Frequency Integrated Circuits (RFIC) Symposium. Digest of Papers. Phoenix AZ, May 20-22, 2001, IEEE Radio Frequency Integrated Circuits Symposium, New York, NY: IEEE, U.S., May 20, 2001, pp. 99-102, XP010551330.

A. Karimi-Sanjaani et al., "A 2 Ghz Merged CMOS LNA and Mixer for WCDMA", 2001 Symposium on VLSI Circuits. Digest of Technical Papers. Kyoto, Japan, Jun. 14-16, 2001, Symposium on VLSI Circuits, Tokyo: JSAP, JP, Jun. 14, 2001, pp. 19-22, XP010551482.

* cited by examiner

AMPLIFIER AND FREQUENCY CONVERTER

BACKGROUND OF THE INVENTION

1. Field of the Invention

The present invention relates to amplifiers for amplifying an input signal, and frequency converters for amplifying an input signal and then converting the frequency of the amplified signal. More specifically, the present invention relates to an amplifier and a frequency converter both having a wide dynamic range and suitable for integration into a semiconductor integrated circuit.

2. Description of the Background Art

In receivers of a wireless system, typified by cellular phones, a signal received at an antenna is amplified by an amplifier circuit at an initial stage. Such an initial-stage amplifier circuit is required to have characteristics of achieving low noise and high gain when receiving a weak signal, while achieving low distortion and low gain when receiving a large signal. Particularly, in recent mobile communications, since the characteristics of a reception electric field are greatly varied in accordance with a distance between a base station and a mobile station, a wider dynamic range is required than ever in a receiving system.

In order to stabilize the operation of the amplifier circuit, a widely used scheme is inserting a resistance between a signal line and the ground at the input or output of the amplifier circuit. However, insertion of the resistance at the input side causes severe degradation in noise characteristics. Insertion of the resistance at the output side, on the other hand, causes severe degradation in distortion characteristics. Other known schemes for stabilizing the operation of the amplifier circuit include a scheme of applying negative feedback to the input. That is, in this scheme, a signal shifted in phase by 180 degrees is fed back to the input. According to this scheme, it is possible to achieve an amplifier circuit generally having a wide dynamic range, although noise and distortion characteristics are both slightly degraded. Better still, a negative feedback circuit used in this scheme can also operate as a distortion compensator circuit, thereby making the dynamic range still wider with some contrivances of the circuit configuration.

Hereinafter, with reference to FIGS. 15 through 20, six conventional negative feedback amplifiers are exemplarily described. A first conventional example is a "negative feedback power amplifier" disclosed in Japanese Laid-Open Patent Publication No. 10-22751 (1998-22751) (see FIG. 15). The amplifier as illustrated in FIG. 15 includes a negative feedback circuit which is capable of operating as a distortion compensator circuit and is used in a microwave band. In FIG. 15, transistors 601 and 602 are both field-effect transistors. Inductors 603, 604, and 605, and capacitors 606 and 607 form a matching circuit for the transistors 601 and 602. A microstrip line 608 serves as a phase shifter. A power voltage Vcc is applied via the microstrip line 608 to the amplifier.

Part of an output signal from the transistor 602 is fed via the inductor 605, the microstrip line 608, and then the inductor 604 back to the input of the transistor 601. Here, a length L of the microstrip line 608 is adjusted so that the feedback signal and the output signal from the transistor 602 are different in phase from each other by 180 degrees. With part of the output signal including a distortion component being inverted in phase for feedback to the input, distortion characteristics in a high frequency band can be improved.

A second conventional example is a "high-output amplifier" disclosed in Japanese Laid-Open Patent Publication No. 6-216670 (1994-216670) (see FIG. 16). The amplifier as illustrated in FIG. 16 includes strip lines 701a and 701b as signal lines, a signal-amplifying transistor 702, a directional coupler 703, a feedback strip line 704, a stub 705, resistances 706a and 706b for changing the amount of feedback, a level detector circuit 707, a harmonic suppression controller circuit 708, and a terminator resistance 709.

In FIG. 16, an input supplied via the signal-line strip line 701a is amplified by the signal-amplifying transistor 702. An output from the transistor 702 is fed, via the feedback strip line 704 having a predetermined line length and then the directional coupler 703, back to the input of the signal-amplifying transistor 702 for signal amplification. With this, a signal opposite in phase to a second harmonic is fed back to the input of the signal-amplifying transistor 702. As such, with the distortion of the second harmonic being cancelled, the linearity of the signal-amplifying transistor 702 can be improved.

A third conventional example is an "amplifier" disclosed in PCT International Publication No. WO96/25791 (see FIG. 17). The amplifier as illustrated in FIG. 17 includes a transistor 801, signal sources 802 and 803, a signal source resistance 804, an input matching circuit composed of components denoted by reference numerals 805, 806, 807, 808 and 809, an output matching circuit composed of components denoted by reference numerals 810, 811 and 815, a band-pass filter 812, a phase shifter 813, a variable attenuator 814, and a load resistance 816.

In FIG. 17, the band-pass filter 812 passes a second harmonic of an output from the transistor 801. The phase shifter 813 and the variable attenuator 814 adjust the phase and amplitude of the second harmonic, respectively. In this amplifier, as with the second conventional example, the second harmonic of the output signal is fed back to the input, thereby reducing the third-order intermodulation product of the amplifier.

A fourth conventional example is a "power amplifier" disclosed in Japanese Laid-Open Patent Publication No. 7-94954 (1995-94954) (see FIG. 18). The amplifier as illustrated in FIG. 18 includes a combiner 901, a power amplifier 902, a divider 903, a filter 904, a variable phase shifter 905, and a variable attenuator 906. This amplifier phase-shifts a fundamental wave and higher order waves (a second or third- or fourth-order harmonic, etc.) of the output from the power amplifier 902 by 180 degrees in a wide band, and the resultant wave is fed back to the input of the power amplifier 902. As such, with the fundamental wave and the second harmonic of the output from the power amplifier 902 being negatively fed back to the input, it is possible to compensate for distortion of the output signal.

A fifth conventional example is a "wide-band feedback amplifier" disclosed in Japanese Laid-Open Patent Publication 10-335954 (1998-335954) (see FIG. 19). The amplifier as illustrated in FIG. 19 includes an amplifying device 1001, a signal input 1002, a signal output 1003, a slot line ground plane 1004, a slot line open plane 1005, a strip line 1006, a microstrip line 1007 in a slot line conversion part, a slot line 1008, via holes 1009, through holes 1010, and a resistance 1011 for determining the amount of feedback. As with the fourth conventional example, this amplifier shifts the phase of the output from the amplifying device 1001 by 180 degrees in a wide band, and then feeds the results back to the input of the amplifying device 1001. As such, with the fundamental wave and the second harmonic of the output from the amplifying device 1001 being negatively fed back to the input, it is possible to compensate for distortion of the output signal. The gazette of this publication discloses a specific example of a feedback circuit for phase shift by 180 degrees in a wide band.

A sixth conventional example is a "broadband amplification with high linearity and low power consumption" disclosed in PCT International Publication No. WO00/45505 (see FIG. 20). The amplifier as illustrated in FIG. 20 includes an input transistor 1101, an output transistor 1102, a series reactive feedback network 1103, and a shunt reactive feedback network 1104. The input transistor 1101 and the output transistor 1102 are coupled in a cascode configuration with the input transistor defining an input of the amplifier and the output transistor defining an output of the amplifier. The shunt reactive feedback network 1104 is coupled between the input and the output and is characterized by an impedance of substantially zero resistance and non-zero reactance. With the above-described circuit configuration, it is possible to improve distortion characteristics without degrading noise characteristics.

However, the above first through sixth conventional examples have a drawback that due to only one type of shunt feedback path being provided for each conventional example, the feedback circuit is complex in structure and large in size in order to shift the feedback signal in phase by approximately 180 degrees with respect to the input signal. Further, in the amplifier of the first conventional example, the second harmonic is shifted in phase by almost 360 degrees for feedback to the input. Therefore, this amplifier does not perform distortion compensation by negative feedback of the second harmonic. In the amplifiers of the second and third conventional examples, the fundamental wave is barely fed back. Therefore, these amplifiers do not perform distortion compensation by negative feedback of the third-order intermodulation wave occurring at a frequency in the vicinity of the frequency of the fundamental wave. Furthermore, in the amplifiers of the fourth and fifth conventional examples, a process of phase adjustment made to both of the fundamental wave and the harmonic is performed only by the feedback circuit, thereby making the feedback circuit complex in structure and large in size.

SUMMARY OF THE INVENTION

Therefore, an object of the present invention is to provide a negative feedback amplifier and a negative feedback frequency converter each of a simple structure, capable of providing negative feedback of the phases of a fundamental wave and a third-order intermodulation wave of an input signal to the input, and suitable for integration into a semiconductor integrated circuit. Further, another object of the present invention is to provide a negative feedback amplifier and a negative feedback frequency converter capable of providing negative feedback of a phase of a second harmonic of the input signal to the input, in addition to the fundamental wave and the third-order intermodulation wave of the input signal.

The present invention has the following features to attain the objects mentioned above.

An amplifier of the present invention comprises: an amplifier circuit for amplifying an input signal; a first feedback circuit for feeding a feedback output of the amplifier circuit back to an input of the amplifier circuit while changing a phase of the signal; and a second feedback circuit for feeding an output of the amplifier circuit back to the input of the amplifier circuit while changing a phase of the signal. With this, flexibility of the circuit is increased.

Therefore, it is possible to shift a phase of a signal in which fundamental waves included in two feedback signals are combined by approximately 180 degrees from a phase of a fundamental wave of an input signal with a simple circuit structure. Also, it is possible to shift a phase of a signal in which second harmonics included in the two feedback signals are combined by approximately 180 degrees from the phase of a fundamental wave of the input signal.

The amplifier of the present invention includes an amplifier to which a single-ended signal is inputted and an amplifier to which a differential signal composed of an in-phase signal and an opposite-phase signal is inputted.

In the amplifier to which a single-ended signal is inputted, each of the amplifier circuit, the first feedback circuit, and the second feedback circuit inputs and outputs the single-ended signal. In this case, as the first feedback circuit, a circuit including an inductor (or a circuit in which an inductor and a capacitor are connected to each other in parallel) being connected to a feedback terminal of the amplifier circuit and a ground; and a capacitor being connected to the feedback terminal and an input terminal is used. As the amplifier circuit, a circuit including a first bipolar transistor having a base being connected to an input and having an emitter being connected to the feedback terminal of the amplifier circuit; and a second bipolar transistor having an emitter being connected to a collector of the first bipolar transistor and having a collector being connected to an output, or a circuit including a bipolar transistor having a base being connected to the input, having an emitter being connected to the feedback terminal of the amplifier circuit, and having a collector being connected to the output is used. As the second feedback circuit, a circuit formed by connecting a capacitor in series to a circuit in which a resistance and a capacitor are connected to each other in parallel, a circuit formed by connecting a capacitor in parallel to a circuit in which a resistance and a capacitor are connected to each other in series, or a circuit in which a resistance or an inductor is placed between a connecting point of two capacitors being connected to each other in series and a ground is used.

In the amplifier to which a differential signal is inputted, the amplifier circuit includes: an in-phase amplifying section having an in-phase input terminal and an in-phase feedback terminal and operating based on an in-phase signal; and an opposite-phase amplifying section having an opposite-phase input terminal and an opposite-phase feedback terminal and operating based on an opposite-phase signal, the first feedback circuit includes one or more feedback sections, and the second feedback circuit includes: an in-phase feedback section operating based on the in-phase signal; and an opposite-phase feedback section operating based on the opposite-phase signal. In this case, as the first feedback circuit, a circuit (a circuit A) including a first feedback section being connected to a ground, the in-phase feedback terminal, and the in-phase input terminal; and a second feedback section being connected to a ground, the opposite-phase feedback terminal, and the opposite-phase input terminal, a circuit (a circuit B) including a first feedback section being connected to a node point, the in-phase feedback terminal, and the in-phase input terminal; a second feedback section being connected to the node point, the opposite-phase feedback terminal, and the opposite-phase input terminal; and a third feedback section being connected to the node point and a ground, or a circuit (a circuit C) including a first feedback section being connected to a connecting point of the in-phase feedback terminal and the opposite-phase feedback terminal and the in-phase input terminal; a second feedback section being connected to the connecting point and the opposite-phase input terminal; and a third feedback section being connected to the connecting point and a ground is used. Such a feedback section is composed of an inductor, or a circuit in which an inductor and a capacitor are connected to each other in parallel.

Also, as the in-phase amplifying section and the opposite-phase amplifying section, a circuit including a first bipolar transistor having a base and an emitter, the base being connected to the input and the emitter being connected to either the in-phase feedback terminal or the opposite-phase feedback terminal; and a second bipolar transistor having an emitter being connected to a collector of the first bipolar transistor and having a collector being connected to the output, or a circuit including a bipolar transistor having a base being connected to the input, having an emitter being connected to either the in-phase feedback terminal or the opposite-phase feedback terminal, and having a collector being connected to the output is used. The in-phase feedback section and the opposite-phase feedback section may include a circuit formed by connecting a capacitor in series to a circuit in which a resistance and a capacitor are connected to each other in parallel, a circuit formed by connecting a capacitor in parallel to a circuit in which a resistance and a capacitor are connected in series, or a circuit in which a resistance or an inductor is placed between a connecting point of two capacitors being connected to each other in series and a ground.

Furthermore, by adding a frequency converter circuit for converting the frequency of an amplified signal to the amplifier of the present invention, a frequency converter of the present invention can be achieved. Component elements included in the frequency converter of the present invention are structured similarly to their counterparts included in the amplifier of the present invention. A wireless receiver of the present invention comprises: the amplifier of the present invention for amplifying a reception signal received by an antenna; the frequency converter of the present invention for converting a frequency of an output of the amplifier; an interfering signal determination section for making a determination on an interfering signal for the reception signal; and a control section for changing consumption current in the amplifier and the frequency converter based on the determination result in the interfering signal determination section.

According to the amplifier of the present invention, with appropriate design of the first and second feedback circuits, a fundamental wave, a third-order intermodulation wave, and a second harmonic of the input signal can be negatively fed back with a simple structure. Therefore, it is possible to provide an amplifier having a wide dynamic range.

According to the amplifier to which a single-ended signal is inputted, a fundamental wave, a third-order intermodulation wave, and a second harmonic of the input signal can be negatively fed back with a simple structure in the case where a nondifferential signal is inputted. In this case, with the use of the above-stated first feedback circuit, it is possible to adjust the passing phase in the amplifier circuit by appropriately selecting the value of the inductor (or the values of the inductor and the capacitor) Especially, with the use of the first feedback circuit having the inductor and the capacitor, a phase control over the fundamental wave and the second harmonic can be more flexibly performed. Also, with the use of the above-stated amplifier circuit, a cascode amplifier circuit (or a single-type amplifier circuit) can be used for amplifying an input signal. Especially, with the use of such a single-type amplifier circuit, an amplifier having low noise characteristics can be achieved. Furthermore, with the use of the above-stated second feedback circuit, it is possible to adjust the passing phase in the second feedback circuit by appropriately selecting characteristics of each component element of the second feedback circuit.

According to the amplifier to which a differential signal is inputted, a fundamental wave, a third-order intermodulation wave, and a second harmonic of the input signal can be negatively fed back with a simple structure in the case where a differential signal is inputted. In this case, with the use of the above-stated first feedback circuit, the in-phase feedback section, and the opposite-phase feedback section, the amplifier to which a differential signal is inputted has the effect similar to that of the amplifier to which a single-ended signal is inputted. Especially, with the use of the first feedback circuit structured as the above-stated circuit B, the fundamental wave, the third-order intermodulation wave, and the second harmonic of the input signal can be negatively fed back with high flexibility. Also, with the use of the first feedback circuit structured as the above-stated circuit C, the fundamental wave, the third-order intermodulation wave, and the second harmonic of the input signal can be negatively fed back with a simple structure while differential circuits in the differential amplifier circuit keep forming a good pair.

According to the frequency converter of the present invention, with appropriate design of the first and second feedback circuits, a fundamental wave, a third-order intermodulation wave, and a second harmonic of the input signal can be negatively fed back with a simple structure. Therefore, it is possible to provide a frequency converter having a wide dynamic range. Also, according to the wireless terminal of the present invention, it is possible to widen a dynamic range of the amplifier and the frequency converter while minimizing the increase in the consumption current.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

First Embodiment

Figure 1:
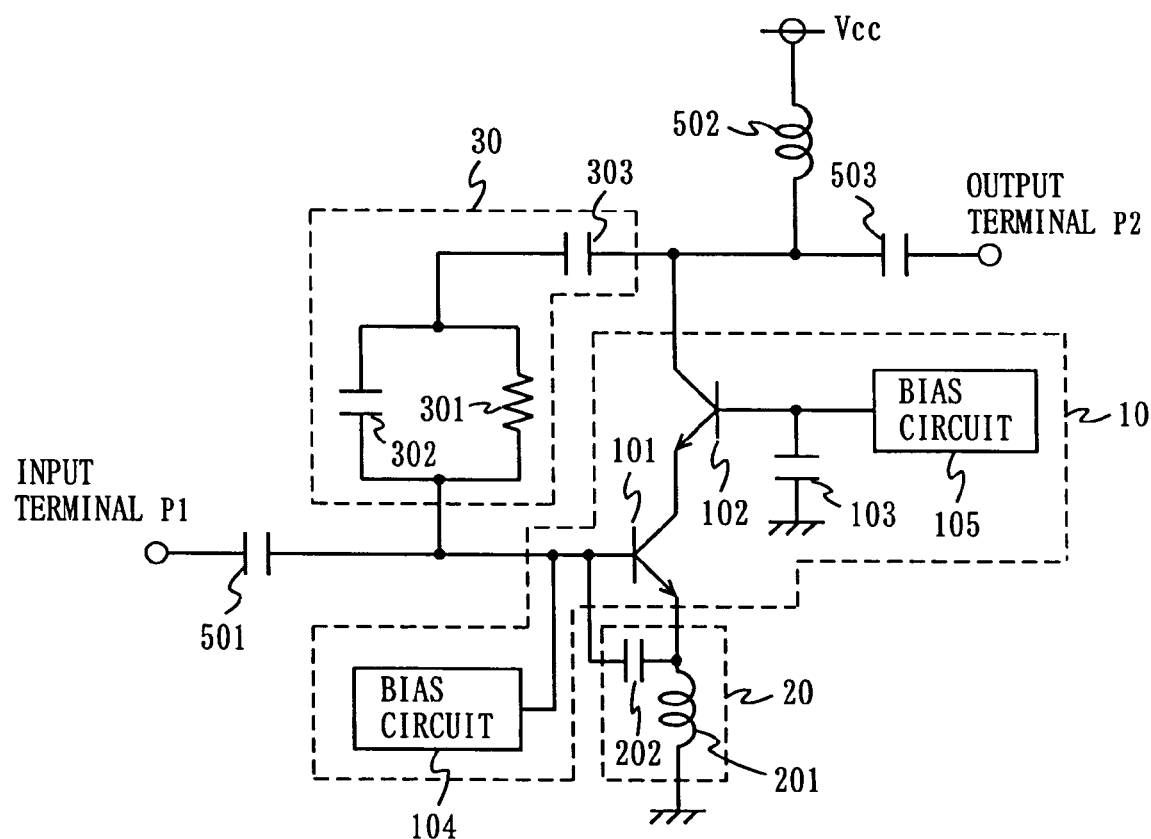
FIG. 1 is a circuit diagram of an amplifier according to a first embodiment of the present invention.

FIG. 1 is a circuit diagram of an amplifier according to a first embodiment of the present invention. The amplifier as shown in FIG. 1 includes an amplifier circuit 10, a first feedback circuit 20, a second feedback circuit 30, DC cut capacitors 501 and 503, and a choke inductor 502. This amplifier has a feature where the operations of the first feedback circuit 20 and the second feedback circuit 30 cause a phase of a signal in which fundamental waves included in two feedback signals are combined and a phase of a signal in which second harmonics included in two feedback signals are combined to be shifted by approximately 180 degrees from a phase of a fundamental wave of an input signal. Also, the amplifier is used mainly in a high frequency band.

The amplifier circuit 10 includes bipolar transistors 101 and 102, a bypass capacitor 103, and bias circuits 104 and 105. The amplifier circuit 10 amplifies a signal inputted from an input terminal P1. The first feedback circuit 20 includes an inductor 201 and a capacitor 202. The first feedback circuit 20 feeds the output from the emitter (a feedback terminal of the amplifier circuit 10) of the bipolar transistor 101 included in the amplifier circuit 10 back to the input of the amplifier circuit 10. The inductor 201 and the capacitor 202 are used for adjusting the passing phase of the first feedback circuit 20. The second feedback circuit 30 includes a resistance 301, a capacitor 302, and a DC cut capacitor 303, so as to feed the output from the collector (an output terminal of the amplifier circuit 10) of the bipolar transistor 102 included in the amplifier circuit 10 back to the input of the amplifier circuit 10. The resistance 301 and the capacitor 302 are used for adjusting the passing phase of the second feedback circuit 30.

In the amplifier as illustrated in FIG. 1, the input terminal P1 is connected via the DC cut capacitor 501 to the base of the bipolar transistor 101. The collector of the bipolar transistor 101 is connected to the emitter of the bipolar transistor 102, whereas the collector of the bipolar transistor 102 is connected via the DC cut capacitor 503 to an output terminal P2. The emitter of the bipolar transistor 101 is grounded via the inductor 201. The capacitor 202 is inserted between the base and emitter of the bipolar transistor 101. The bases of the bipolar transistors 101 and 102 are supplied with a base current from the bias circuits 104 and 105, respectively. The resistance 301 and the capacitor 302 are connected to each other in parallel. This parallel circuit and the DC cut capacitor 303 are inserted in series between the base of the bipolar transistor 101 and the collector of the bipolar transistor 102. The base of the bipolar transistor 102 is grounded via the bypass capacitor 103. A power voltage Vcc is supplied via the choke inductor 502 to the collector of the bipolar transistor 102.

Figure 2A:
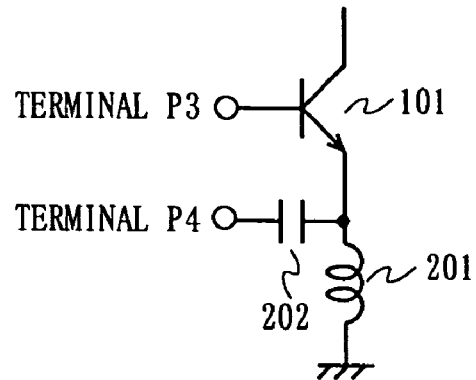
FIGS. 2A through 2F are illustrations for describing an operation of the amplifier according to the first embodiment of the present invention.
Figure 2B:
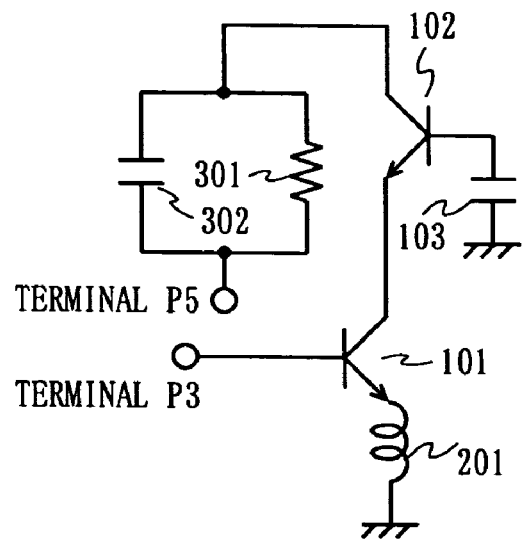
Figure 2C:
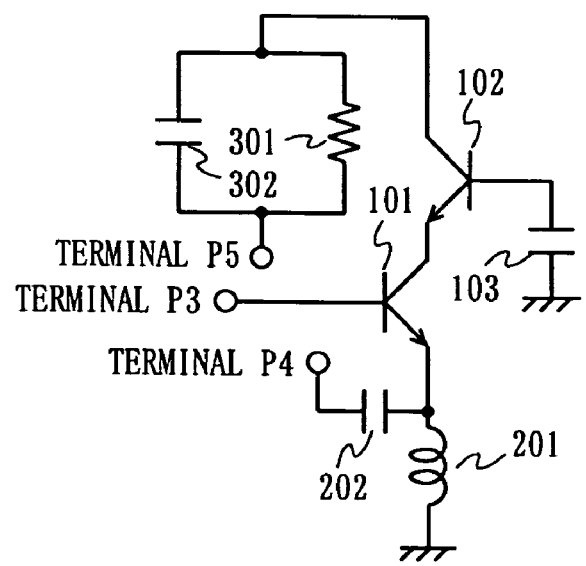

With reference to FIGS. 2A through 2F, the operation of the amplifier as illustrated in FIG. 1 will be described below. Here, passing phase characteristics are studied below on the following three circuits: a circuit as illustrated in FIG. 2A including the bipolar transistor 101, the inductor 201, and the capacitor 202; a circuit as illustrated in FIG. 2B including the bipolar transistors 101 and 102, the bypass capacitor 103, the inductor 201, the resistance 301, and the capacitor 302; and a circuit as illustrated in FIG. 2C having therein the circuit as illustrated in FIG. 2B to which the capacitor 202 is added.

Figure 2D:
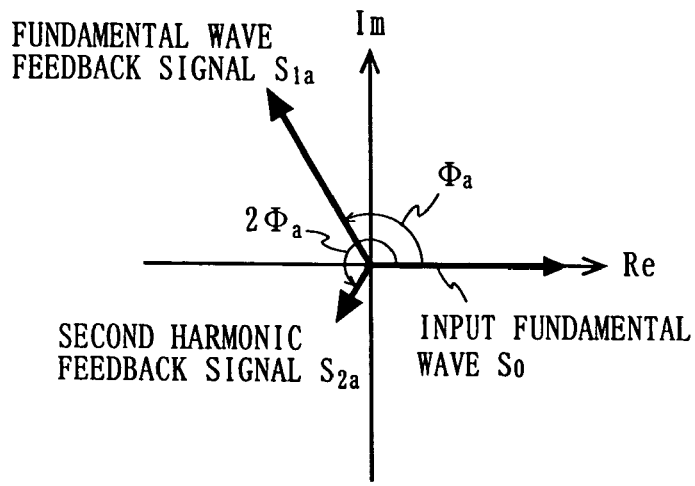

FIG. 2D is a phasor diagram of an input signal (a fundamental wave) and an output signal (a fundamental wave and a second harmonic) in the circuit as illustrated in FIG. 2A. As illustrated in FIG. 2D, a fundamental wave $S_{1a}$ included in the feedback signal outputted from a terminal P4 leads a fundamental wave $S_0$ of a signal inputted to a terminal P3 by a phase angle of $\Phi_a$. Also, a second harmonic $S_{2a}$ included in the feedback signal outputted from the terminal P4 leads the fundamental signal $S_0$ of the input signal by a phase angle of $2\Phi_a$. A ratio of lead in the passing phase is determined by the values of the inductor 201 and the capacitor 202.

Figure 2E:
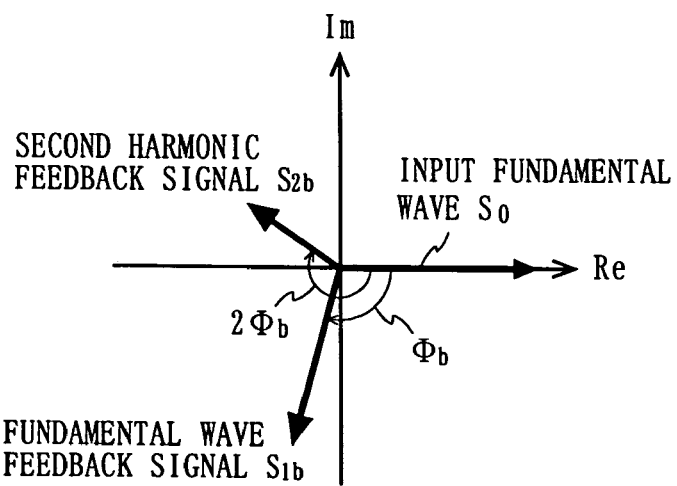

FIG. 2E is a phasor diagram of an input signal (a fundamental wave) and an output signal (a fundamental wave and a second harmonic) in the circuit as illustrated in FIG. 2B. As illustrated in FIG. 2E, a fundamental wave $S_{1b}$ included in the feedback signal outputted from a terminal P5 lags behind the fundamental wave $S_0$ of the signal inputted to the terminal P3 by a phase angle of $\Phi_b$. Also, a second harmonic $S_{2b}$ included in the feedback signal outputted from the terminal P5 lags behind the fundamental wave $S_0$ of the input signal by a phase angle of $2\Phi_b$. A ratio of delay in the passing phase is determined by the values of the resistance 301 and the capacitor 302.

Figure 2F:
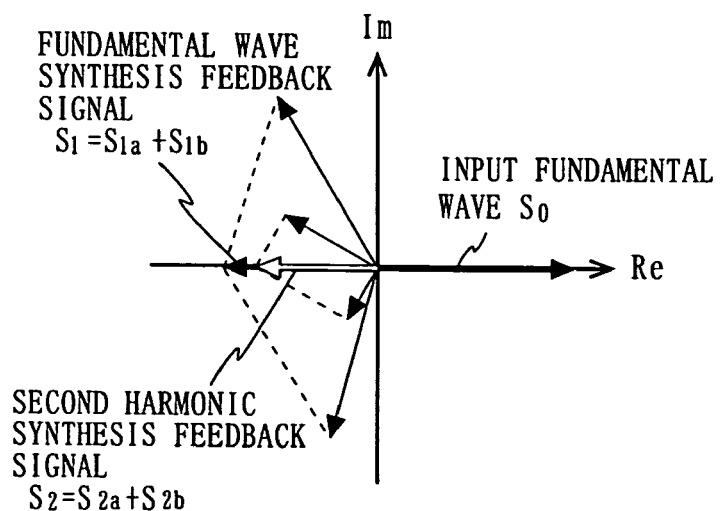

FIG. 2F is a phasor diagram of an input signal (a fundamental wave) and an output signal (a fundamental wave and a second harmonic) in the circuit as illustrated in FIG. 2C. A vector addition for calculating a synthesis signal of the feedback signals as illustrated in FIGS. 2D and 2E (hereinafter, referred to as a synthesis feedback signal) is illustrated in FIG. 2F. According to FIG. 2F, the synthesis feedback signal includes $(S_{1a}+S_{1b})$ as a fundamental wave component, and $(S_{2a}+S_{2b})$ as a second harmonic component.

The circuit as illustrated in FIG. 2C has two feedback paths. As a result, by appropriately selecting the values of the inductor 201, the capacitors 202 and 302, and the resistance 301, it is possible to shift the phase of the fundamental wave $(S_{1a}+S_{1b})$ included in the synthesis feedback signal and the phase of the second harmonic $(S_{2a}+S_{2b})$ included in the synthesis feedback signal from the phase of the fundamental wave $S_0$ of the input signal by approximately 180 degrees as illustrated in FIG. 2F.

Thus, the amplifier as illustrated in FIG. 1 can feed the second harmonic shifted in phase by 180 degrees back to the input. That is, the second harmonic can be negatively fed back to the input. Furthermore, the frequency of the third-order intermodulation wave is adjacent to the frequency of the fundamental wave. Therefore, the amplifier of the present embodiment can feed the third-order intermodulation wave shifted in phase by 180 degrees back to the input. That is, the third-order intermodulation wave can be negatively fed back to the input.

As such, in the amplifier as illustrated in FIG. 1, the passing phase of the first feedback circuit 20 is adjusted by the inductor 201 and the capacitor 202, whereas the passing phase of the second feedback circuit 30 is adjusted by the resistance 301 and the capacitor 302. With this, it is possible to negatively feed the fundamental wave, the third-order intermodulation wave, and the second harmonic of the input signal back to the input as a synthesis vector of the outputs of the two feedback circuits. Moreover, the amplifier of the present embodiment does not use a strip line or slot line as compared with the conventional amplifiers. Therefore, the amplifier can be easily integrated, even if being used in a microwave band, into a semiconductor integrated circuit.

As described above, according to the amplifier of the present embodiment, the first feedback circuit 20 and the second feedback circuit 30 are used so as to appropriately adjust the phase of the feedback signal. With this, it is possible to achieve, on the entire amplifier, negative feedback of the fundamental wave, the third-order intermodulation wave, and the second harmonic of the input signal. Thus, a high-frequency negative feedback amplifier having a wide dynamic range can be achieved with a simple structure.

Second Embodiment

Figure 3:
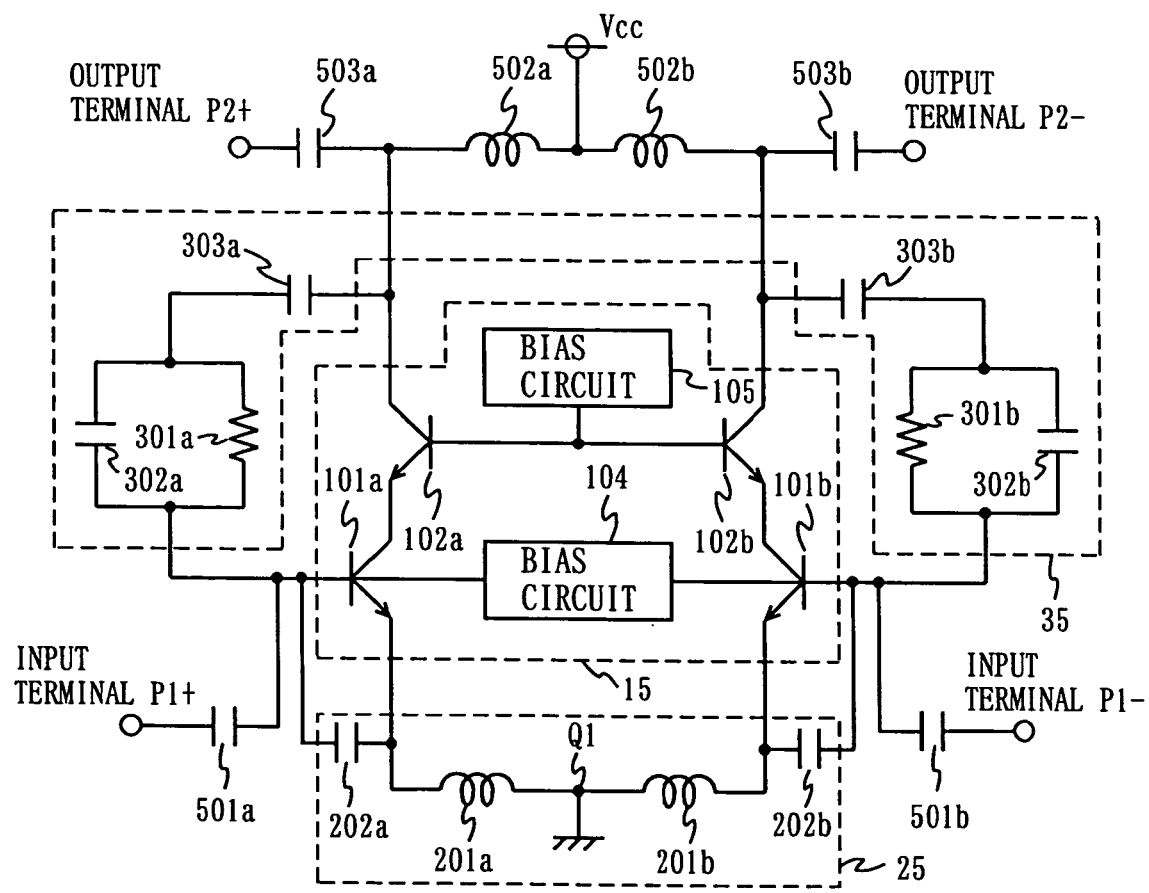
FIG. 3 is a circuit diagram of an amplifier according to a second embodiment of the present invention.

FIG. 3 is a circuit diagram of an amplifier according to a second embodiment of the present invention. The amplifier as illustrated in FIG. 3 differs from that according to the first embodiment in that it is structured by a differential pair. The operation and effect of the amplifier which will be described below are similar to those of the amplifier according to the first embodiment, and therefore descriptions thereof are omitted. Hereinafter, only the circuit configuration will be described.

The amplifier as illustrated in FIG. 3 includes an amplifier circuit 15, a first feedback circuit 25, a second feedback circuit 35, DC cut capacitors 501a, 501b, 503a, and 503b, and choke inductors 502a and 502b. The amplifier circuit 15, the first feedback circuit 25, and the second feedback circuit 35 are exemplary modifications of the amplifier circuit 10, the first feedback circuit 20, and the second feedback circuit 30 according to the first embodiment, respectively, each of which is structured by a differential pair.

The amplifier circuit 15 includes bipolar transistors 101a, 101b, 102a, and 102b, and bias circuits 104 and 105. The amplifier circuit 15 amplifies a differential signal input via a pair of input terminals {P1+, P1−}. The first feedback circuit 25 includes inductors 201a and 201b and capacitors 202a and 202b. These inductors 201a and 201b and the capacitors 202a and 202b are used for adjusting the passing phase of the first feedback circuit 25. The second feedback circuit 35 includes resistances 301a and 301b, capacitors 302a and 302b, and DC cut capacitors 303a and 303b, so as to feed the output of the amplifier circuit 15 back to the input thereof. The resistances 301a and 301b and the capacitors 302a and 302b are used for adjusting the passing phase of the second feedback circuit 35. Note that, in the differential circuit, it is possible to achieve the same effect as a bypass capacitor of a nondifferential circuit only by connecting a pair of transistors. Thus, the amplifier circuit 15 does not need to include a bypass capacitor separately.

In the amplifier as illustrated in FIG. 3, the input terminal P1+ is connected via the DC cut capacitor 501a to the base of the bipolar transistor 101a, whereas the input terminal P1− is connected via the DC cut capacitor 501b to the base of the bipolar transistor 101b. The collectors of the bipolar transistors 101a and 101b are connected to the emitters of the bipolar transistors 102a and 102b, respectively. The collector of the bipolar transistor 102a is connected via the DC cut capacitor 503a to an output terminal P2+, whereas the collector of the bipolar transistor 102b is connected via the DC cut capacitor 503b to an output terminal P2−. The emitters of the bipolar transistors 101a and 101b are connected to the inductors 201a and 201b, respectively, at one end of the inductors 201a and 201b. At the other end of the inductors 201a and 201b, the inductors 201a and 201b are connected to each other, and their connecting point Q1 is grounded. The capacitor 202a is inserted between the base and emitter of the bipolar transistor 101a, whereas the capacitor 202b is inserted between the base and emitter of the bipolar transistor 101b. The base of each of the bipolar transistors 101a and 101b is supplied with a base current from the bias circuit 104. The base of each of the bipolar transistors 102a and 102b is supplied with a base current from the bias circuit 105.

The resistance 301a and the capacitor 302a are connected to each other in parallel so as to form a parallel circuit. This parallel circuit and the DC cut capacitor 303a are inserted in series between the base of the bipolar transistor 101a and the collector of the bipolar transistor 102a. The resistance 301b and the capacitor 302b are connected to each other in parallel so as to form a parallel circuit. This parallel circuit and the DC cut capacitor 303b are inserted in series between the base of the bipolar transistor 101b and the collector of the bipolar transistor 102b. The power voltage Vcc is supplied via the choke inductors 502a and 502b to the collectors of the bipolar transistors 102a and 102b, respectively.

Third Embodiment

Figure 4:
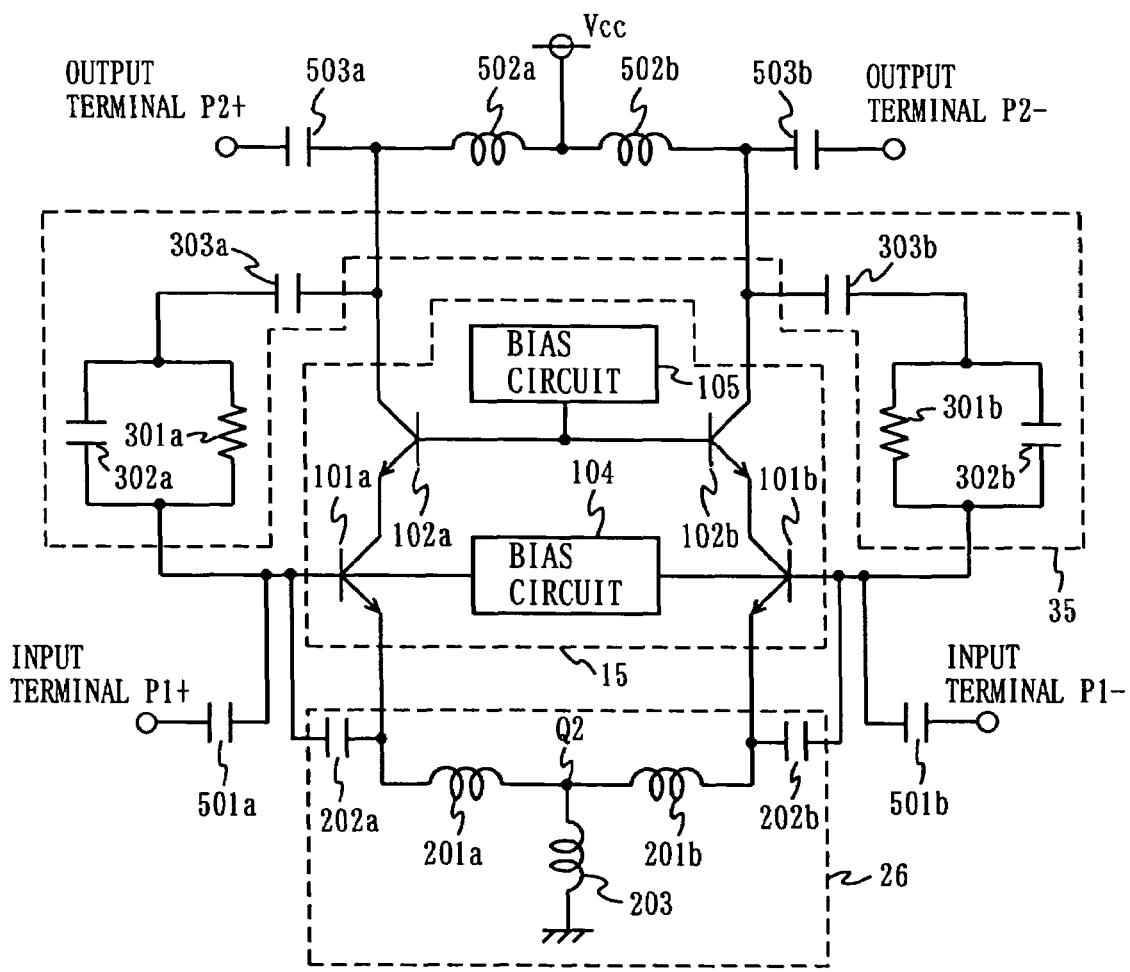
FIG. 4 is a circuit diagram of an amplifier according to a third embodiment of the present invention.

FIG. 4 is a circuit diagram of an amplifier according to a third embodiment of the present invention. The amplifier as illustrated in FIG. 4 is similar to that according to the second embodiment, except that the first feedback circuit 25 is replaced by a first feedback circuit 26. Therefore, in FIG. 4, components similar to those according to the second embodiment are provided with the same reference numerals, and are not described herein.

The first feedback circuit 26 includes inductors 201a, 201b and 203, and capacitors 202a and 202b. As with the second embodiment, the emitters of the bipolar transistors 101a and 101b are connected to the inductors 201a and 201b, respectively, at one end of the inductors 201a and 201b. At the other end of the inductors 201a and 201b, the inductors 201a and 201b are connected to each other, and their connecting point Q2 is grounded via the inductor 203. The capacitor 202a is inserted between the emitter and base of the bipolar transistor 101a, whereas the capacitor 202b is inserted between the emitter and base of the bipolar transistor 101b. The inductor 203 is used for adjusting the passing phase of the second harmonic of the first feedback circuit 26.

With reference to FIGS. 5A through 5F, the operation of the amplifier as illustrated in FIG. 4 will be described below.

The first feedback circuit 26 is supplied with a differential signal. Therefore, at the connecting point Q2, two input signals are cancelled by each other. The potential at the connecting point Q2 is always 0 even though the input signals are alternating-current signals. Therefore, the passing phase of a fundamental wave component of the output signal is not influenced by the inductor 203. Here, the second harmonic component of the output signal can be represented by using an angular velocity of ω, as $\cos(2\omega t)$ for a non-inverted signal and as $\cos\{2(\omega t+\pi)\}=\cos(2\omega t)$ for an inverted signal. Therefore, it is evident that the non-inverted signal and the inverted signal are in phase. For this reason, the passing phase of the second harmonic component of the output signal is delayed by the influence of the inductor 203.

Figure 5A:
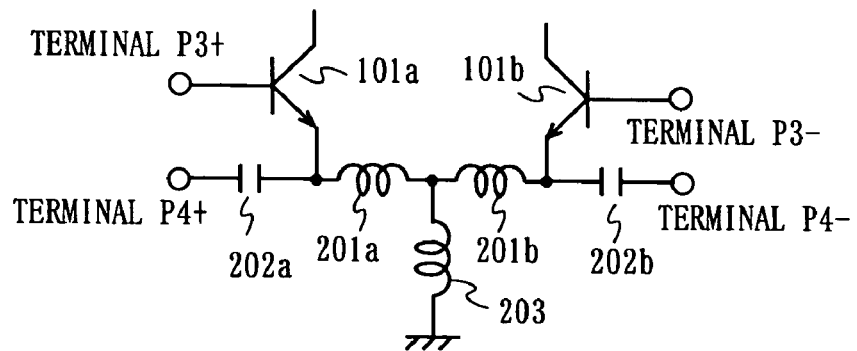
FIGS. 5A through 5F are illustrations for describing an operation of the amplifier according to the third embodiment of the present invention.
Figure 5B:
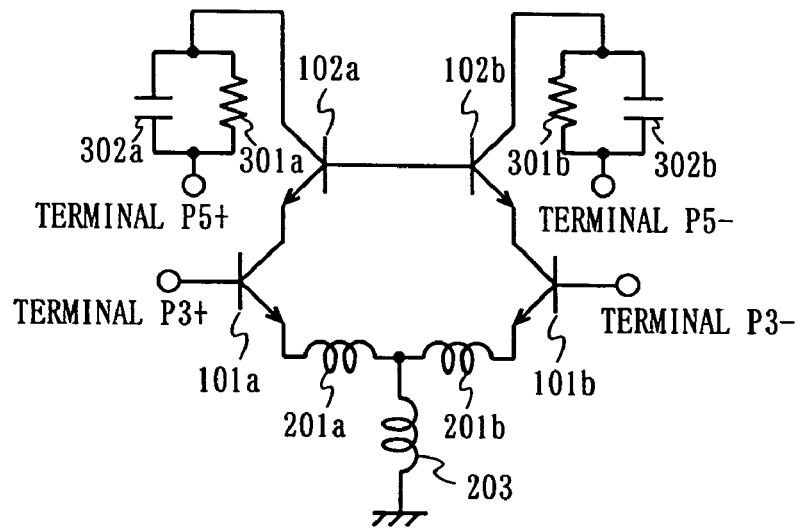
Figure 5C:
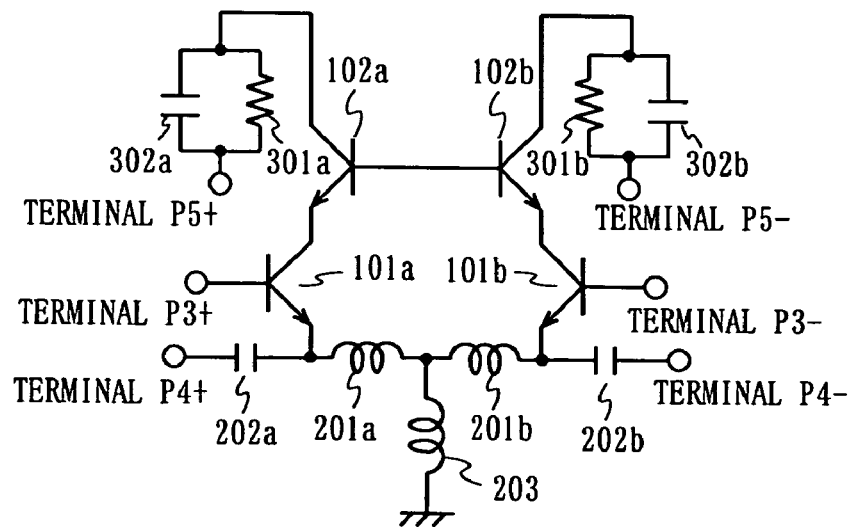

Here, as with the first embodiment, passing phase characteristics will be studied below on the following three circuits: a circuit as illustrated in FIG. 5A including the bipolar transistors 101a and 101b, the inductors 201a, 201b, and 203, and the capacitors 202a and 202b; a circuit as illustrated in FIG. 5B including the bipolar transistors 101a, 101b, 102a, and 102b, the inductors 201a, 201b, and 203, the resistances 301a and 301b, and the capacitors 302a and 302b; and a circuit as illustrated in FIG. 5C having therein the circuit as illustrated in FIG. 5B to which the capacitors 202a and 202b are added.

Figure 5D:
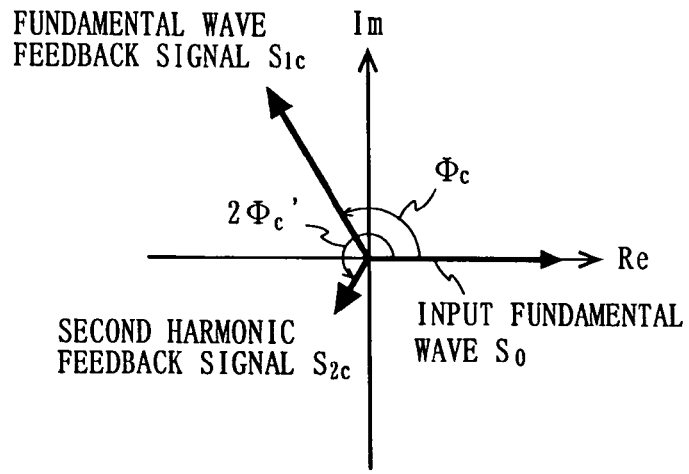

FIG. 5D is a phasor diagram of an input signal (a fundamental wave) and an output signal (a fundamental wave and a second harmonic) in the circuit as illustrated in FIG. 5A. As illustrated in FIG. 5D, a fundamental wave $S_{1c}$ included in the feedback signal outputted from terminals P4+ and P4− leads a fundamental wave $S_0$ of a signal inputted to terminals P3+ and P3− by a phase angle of $\Phi_c$. Also, a second harmonic $S_2$ included in the feedback signal outputted from the terminals P4+ and P4− leads the fundamental signal $S_0$ of the input signal by a phase angle of $2\Phi_c'$ ($<2\Phi_c$). Note that $2\Phi_c'$ is smaller than $2\Phi_c$, and the second harmonic $S_{2c}$ included in the feedback signal lags behind a signal whose phase leading amount is $2\Phi_c$. This is because the passing phase of the fundamental wave is determined by the values of the inductors 201a and 201b, whereas the passing phase of the second harmonic is determined by these values further in consideration of the value of the inductor 203.

Figure 5E:
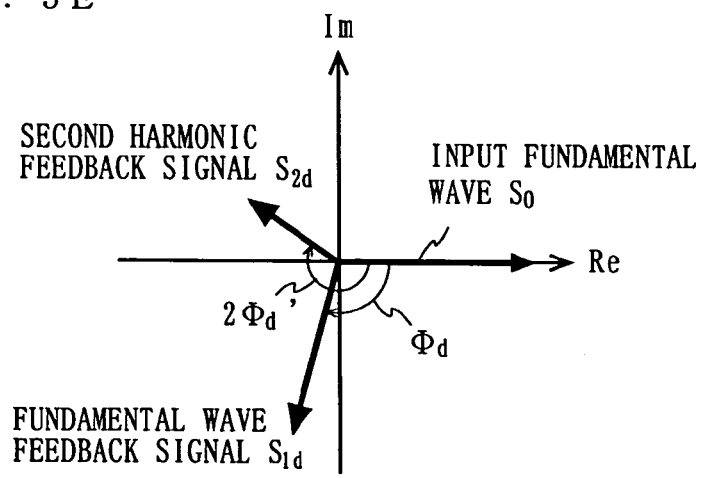

FIG. 5E is a phasor diagram of an input signal (a fundamental wave) and an output signal (a fundamental wave and a second harmonic) in the circuit as illustrated in FIG. 5B. As illustrated in FIG. 5E, a fundamental wave $S_{1d}$ included in the feedback signal outputted from terminals P5+ and P5− lags behind a fundamental wave $S_0$ of a signal inputted to terminals P3+ and P3− by a phase angle of $\Phi d$. Also, a second harmonic $S_{2d}$ included in the feedback signal outputted from the terminals P4+ and P4− lags behind the fundamental signal $S_0$ of the input signal by a phase angle of $2\Phi_d'$ ($<2\Phi_d$). Note that $2\Phi_d'$ is smaller than $2\Phi_d$, and the second harmonic $S_{2d}$ included in the feedback signal leads a signal whose phase leading amount is $2\Phi_d$. This is because the passing phase of the fundamental wave is determined by the values of the inductors 201a and 201b, whereas the passing phase of the second harmonic is determined by these values further in consideration of the value of the inductor 203.

Figure 5F:
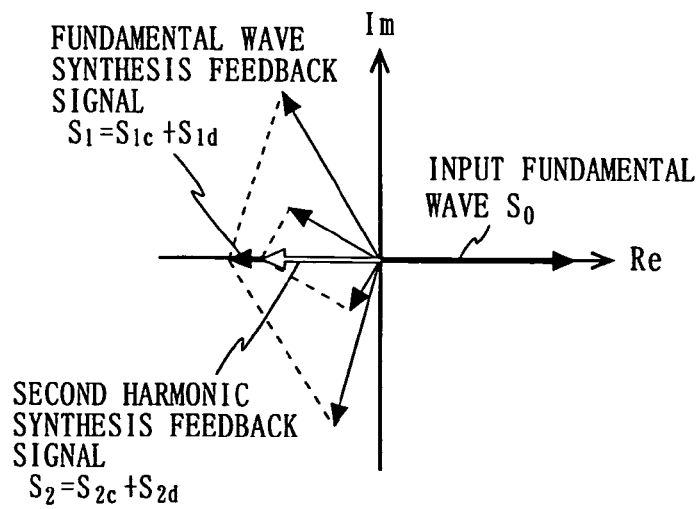

FIG. 5F is a phasor diagram of an input signal (a fundamental wave) and an output signal (a fundamental wave and a second harmonic) in the circuit as illustrated in FIG. 5C. A vector addition for calculating a synthesis signal of the feedback signals as illustrated in FIGS. 5D and 5E (hereinafter, referred to as a synthesis feedback signal) is illustrated in FIG. 5F. According to FIG. 5F, the synthesis feedback signal includes $(S_{1c}+S_{1d})$ as a fundamental wave component, and $(S_{2c}+S_{2d})$ as a second harmonic component.

The circuit as illustrated in FIG. 5C has two feedback paths. As a result, by appropriately selecting the values of the inductors 201a, 201b, and 203, the capacitors 202a, 202b, 302a, and 302b, and the resistances 301a and 301b, it is possible to shift the phase of the fundamental wave $(S_{1c}+S_{1d})$ included in the synthesis feedback signal and the phase of the second harmonic $(S_{2c}+S_{2d})$ included in the synthesis feedback signal from the phase of the fundamental wave $S_0$ of the input signal by approximately 180 degrees as illustrated in FIG. 5F.

Thus, as is the case with the amplifier according to the second embodiment, the amplifier as illustrated in FIG. 4 can negatively feed the second harmonic back to the input. Furthermore, the frequency of the third-order intermodulation wave is adjacent to the frequency of the fundamental wave. Therefore, the amplifier of the present embodiment can negatively feed the third-order intermodulation wave back to the input.

As such, in the amplifier as illustrated in FIG. 4, the passing phase of the first feedback circuit 26 is adjusted by the inductors 201a, 201b, and 203 and the capacitors 202a and 202b, whereas the passing phase of the second feedback circuit 35 is adjusted by the resistances 301a and 301b and the capacitors 302a and 302b. With this, it is possible to negatively feed the fundamental wave, the third-order intermodulation wave, and the second harmonic of the input signal back to the input with a simple structure.

Moreover, as compared with the amplifier according to the second embodiment, the amplifier according to the third embodiment further includes the inductor 203 for separately adjusting the second harmonic component. With this, it is possible to separately adjust the passing phase of each of the fundamental wave, the third-order intermodulation wave, and the second harmonic of the input signal with a simple structure. Therefore, it is possible, for example, to select the values of the inductors 201a and 201b in advance so that other high-frequency characteristics, such as noise characteristics, are optimal, and then select the value of the inductor 203.

As described above, according to the amplifier of the present embodiment, with the inductor 203 being provided, a high-frequency negative feedback amplifier having a wide dynamic range can be achieved with more flexibility than that of the amplifier of the second embodiment.

Fourth Embodiment

Figure 6:
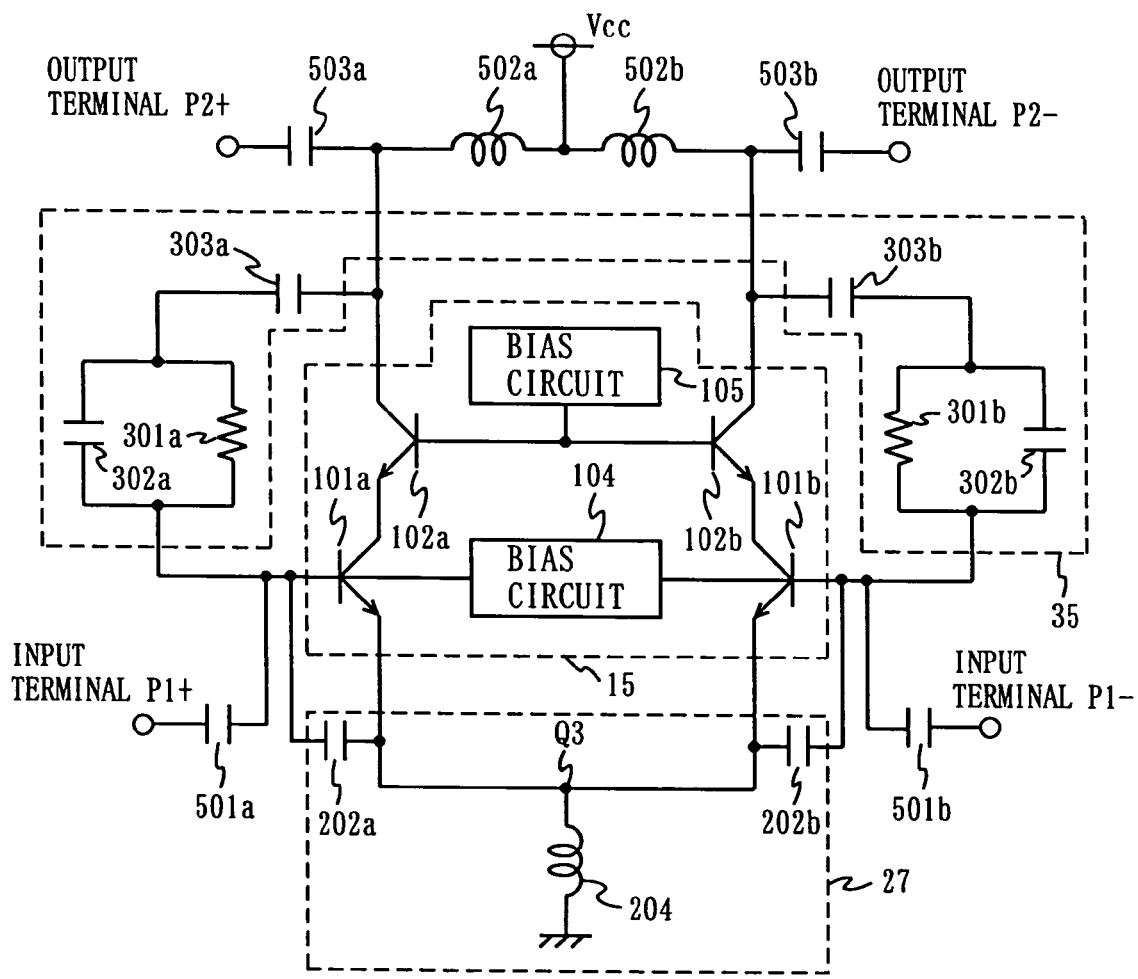
FIG. 6 is a circuit diagram of an amplifier according to a fourth embodiment of the present invention.

FIG. 6 is a circuit diagram of an amplifier according to a fourth embodiment of the present invention. The amplifier as illustrated in FIG. 6 is similar to that according to the second embodiment, except that the first feedback circuit 25 is replaced by a first feedback circuit 27. Therefore, in FIG. 6, components similar to those according to the second embodiment are provided with the same reference numerals, and are not described herein.

The first feedback circuit 27 includes the capacitors 202a and 202b, and an inductor 204. Unlike the second embodiment, the emitters of the bipolar transistors 101a and 101b are directly connected to each other, and their connecting point Q3 is grounded via the inductor 204. The inductor 204 is used for adjusting the passing phase of the second harmonic of the amplifier circuit.

In the amplifier as illustrated in FIG. 6, the operations of the resistances 301a and 301b and the capacitors 202a, 202b, 302a, and 302b cause the fundamental wave shifted in phase by 180 degrees to be fed back to the input. That is, the fundamental wave can be negatively fed back to the input. Also, in this amplifier, the operation of the inductor 204 causes the second harmonic shifted in phase by 180 degrees to be fed back to the input. That is, the second harmonic can be negatively fed back. Moreover, the frequency of the third-order intermodulation wave is adjacent to the frequency of the fundamental wave. Therefore, the amplifier can feed the third-order intermodulation wave shifted in phase by 180 degrees back to the input. That is, the third-order intermodulation wave can be negatively fed back to the input.

As such, in the amplifier as illustrated in FIG. 6, the passing phase of the first feedback circuit 27 is adjusted by the capacitors 202a and 202b and the inductor 204, whereas the passing phase of the second feedback circuit 35 is adjusted by the resistances 301a and 301b and the capacitors 302a and 302b. Therefore, it is possible to achieve negative feedback of the fundamental wave, the third-order intermodulation wave, and the second harmonic of the input signal to the input with a simple structure.

Generally speaking, in a differential amplifier circuit, it is preferable that two differential circuits form a good pair, that is, the characteristics (DC and AC characteristics) of these differential circuits as a pair in the differential amplifier circuit are close to each other. In the amplifiers according to the third embodiment, however, with the use of the inductors 201a and 201b, the differential circuits do not always form a good pair due to variations in stray capacitance, parasitic resistance, etc. By contrast, in the amplifier as illustrated in FIG. 6, the inductors 201a and 201b are not used. Therefore, it is possible to achieve an effect that the differential circuits can keep forming a good pair.

As described above, according to the amplifier of the present embodiment, with the inductors 201a and 201b not being provided, it is possible to achieve a high-frequency negative feedback amplifier having a wide dynamic range while the differential circuits in the differential amplifier circuit keep forming a good pair.

Fifth Embodiment

Figure 7:
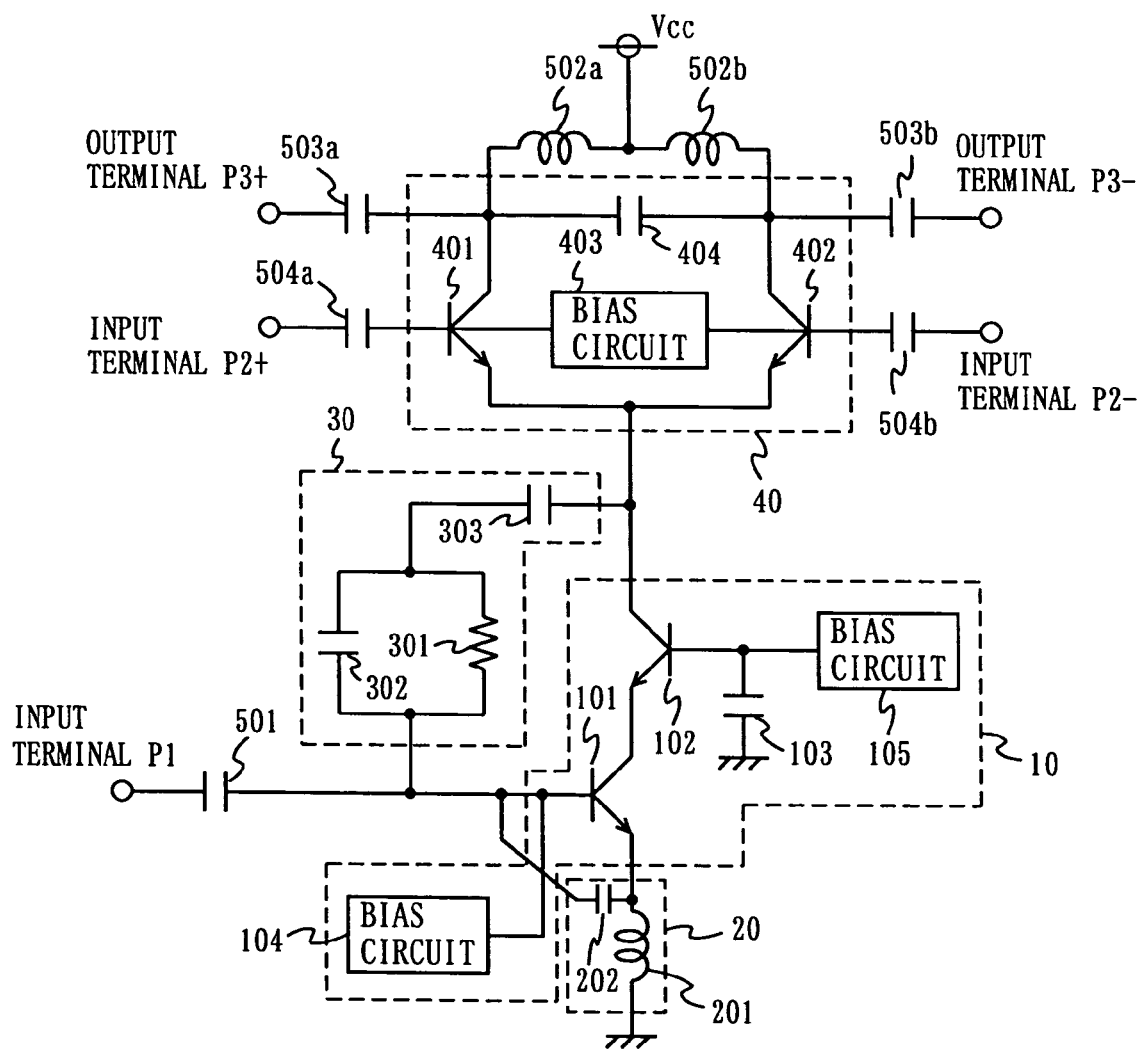
FIG. 7 is a circuit diagram of a frequency converter according to a fifth embodiment of the present invention.

FIG. 7 is a circuit diagram of a frequency converter according to a fifth embodiment of the present invention. The frequency converter as illustrated in FIG. 7 includes the amplifier circuit 10, the first feedback circuit 20, the second feedback circuit 30, a frequency converter circuit 40, DC cut capacitors 501, 503a, 503b, 504a, and 504b, and choke inductors 502a and 502b. This frequency converter is structured by adding the frequency converter circuit 40 to the amplifier according to the first embodiment. In FIG. 7, components similar to those according to the first embodiment are provided with the same reference numerals, and are not described herein.

The frequency converter circuit 40 includes bipolar transistors 401 and 402, a bias circuit 403, and a capacitor 404, thereby converting the frequency of a signal supplied by the amplifier circuit 10.

In the frequency converter as illustrated in FIG. 7, the input terminal P1 is connected via the DC cut capacitor 501 to the base of the bipolar transistor 101. The collector of the bipolar transistor 101 is connected to the emitter of the bipolar transistor 102. The collector of the bipolar transistor 102 is connected to both of the emitters of the bipolar transistors 401 and 402. The collector of the bipolar transistor 401 is connected via the DC cut capacitor 503a to an output terminal P3+, whereas the collector of the bipolar transistor 402 is connected via the DC cut capacitor 503b to an output terminal P3−. The emitter of the bipolar transistor 101 is grounded via the inductor 201. The capacitor 202 is inserted between the base and emitter of the bipolar transistor 101. The bases of the bipolar transistors 101 and 102 are supplied with a base current from the bias circuits 104 and 105, respectively. The base of each of the bipolar transistors 401 and 402 is supplied with a base current from the bias circuit 403.

The resistance 301 and the capacitor 302 are connected to each other in parallel. This parallel circuit and the DC cut capacitor 303 are inserted in series between the base of the bipolar transistor 101 and the collector of the bipolar transistor 102. The base of the bipolar transistor 102 is grounded via the bypass capacitor 103. The collectors of the bipolar transistors 401 and 402 are supplied with a power voltage Vcc via the choke inductors 502a and 502b, respectively.

An input terminal P2+ is connected via the DC cut capacitor 504a to the base of the bipolar transistor 401, whereas an input terminal P2− is connected via the DC cut capacitor 504b to the base of the bipolar transistor 402. The capacitor 404 is inserted between the collectors of the bipolar transistors 401 and 402 for reducing a leak of the second harmonic of a local signal to the output terminals P3+ and P3−.

In normal use, the input terminal P1 is supplied with an RF (Radio Frequency) signal received by an antenna and then amplified by a low-noise amplifier. The input terminals P2+ and P2− are supplied with a LO (Local Oscillator) signal supplied by a local oscillator. Output from the output terminals P3+ and P3− is an IF (Intermediate Frequency) signal mainly including a signal of an intermediate frequency.

As with the amplifier according to the first embodiment, the frequency converter as illustrated in FIG. 7 can feed back the fundamental signal and the second harmonic that have been shifted in phase by 180 degrees of the RF signal supplied by the input terminal P1. That is, the fundamental signal and the second harmonic can be negatively fed back to the input. Moreover, the frequency of the third-order intermodulation wave is adjacent to the frequency of the fundamental wave. Therefore, the frequency converter can feed the third-order intermodulation wave shifted in phase by 180 degrees back to the input. That is, the third-order intermodulation wave can be negatively fed back to the input.

As such, in the frequency converter as illustrated in FIG. 7, the passing phase of the first feedback circuit 20 is adjusted by the inductor 201 and the capacitor 202, whereas the passing phase of the second feedback circuit 30 is adjusted by the resistance 301 and the capacitor 302. Therefore, it is possible to achieve negative feedback of the fundamental wave, the third-order intermodulation wave, and the second harmonic of the input signal to the input with a simple structure. Moreover, the frequency converter of the present embodiment does not use a strip line or slot line as compared with conventional frequency converters. Therefore, the frequency converter can be easily integrated, even if being used in a microwave band, into a semiconductor integrated circuit.

Furthermore, conventional frequency converters have a drawback in which the second harmonic of the LO signal occurring at the frequency converter circuit affects the operation of the amplifier circuit. By contrast, in the frequency converter as illustrated in FIG. 7, the first feedback circuit 20 is adjusted so that the second harmonic of the LO signal occurring at the frequency converter circuit 40 is shifted in phase by 180 degrees by the first feedback circuit 20 and the amplifier circuit 10 for output to the frequency converter circuit 40. As a result, it is possible to reduce the level of the second harmonic of the LO signal occurring at the frequency converter circuit 40.

As described above, according to the frequency converter of the present embodiment, the first feedback circuit 20 and the second feedback circuit 30 are used to appropriately adjust the phase of the feedback signal, thereby achieving, on the entire frequency converter, negative feedback of the fundamental wave, the third-order intermodulation wave, and the second harmonic of the input signal. Therefore, a high-frequency negative feedback frequency converter having a wide dynamic range can be achieved with a simple structure.

Sixth Embodiment

Figure 8:
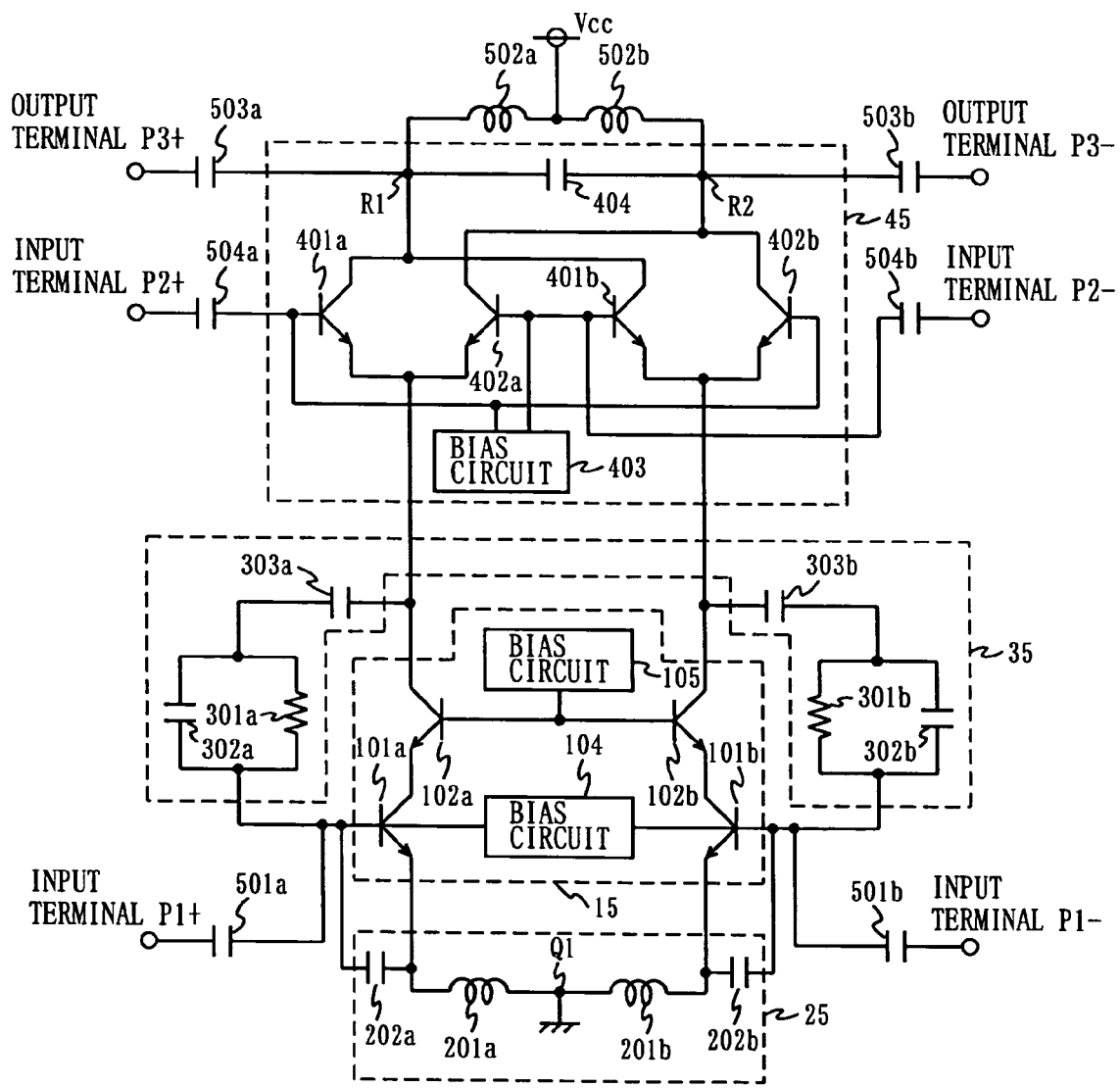
FIG. 8 is a circuit diagram of a frequency converter according to a sixth embodiment of the present invention.

FIG. 8 is a circuit diagram of a frequency converter according to a sixth embodiment of the present invention. The frequency converter as illustrated in FIG. 8 differs from that according to the fifth embodiment in that it is structured by a differential pair. The operation and effect of the frequency converter are similar to those of the frequency converter according to the fifth embodiment, and therefore descriptions thereof are omitted. Hereinafter, only the circuit configuration will be described.

The frequency converter as illustrated in FIG. 8 includes an amplifier circuit 15, a first feedback circuit 25, a second feedback circuit 35, a frequency converter circuit 45, DC cut capacitors 501a, 501b, 503a, 503b, 504a, and 504b, and choke inductors 502a and 502b. The amplifier circuit 15, the first feedback circuit 25, and the second feedback circuit 35 are exemplary modifications of the amplifier circuit 10, the first feedback circuit 20, and the second feedback circuit 30 according to the fifth embodiment, respectively, each of which is structured by a differential pair.

The amplifier circuit 15, the first feedback circuit 25, and the second feedback circuit 35 are similar to those of the frequency converter according to the second embodiment, and therefore descriptions thereof are omitted. The frequency converter circuit 45 includes bipolar transistors 401a, 401b, 402a, and 402b, a bias circuit 403, and a capacitor 404, and converts the frequency of an output signal from the amplifier circuit 15.

In the frequency converter as illustrated in FIG. 8, an input terminal P1+ is connected via the DC cut capacitor 501a to the base of the bipolar transistor 101a, whereas an input terminal P1− is connected via the DC cut capacitor 501b to the base of the bipolar transistor 101b. The collector of the bipolar transistor 101a is connected to the emitter of the bipolar transistor 102a, whereas the collector of the bipolar transistor 101b is connected to the emitter of the bipolar transistor 102b. The collector of the bipolar transistor 102a is connected to both of the emitters of the bipolar transistors 401a and 402a. The collector of the bipolar transistor 102b is connected to both of the emitters of the bipolar transistors 401b and 402b. The collectors of the bipolar transistors 401a and 401b are connected at a connecting point R1, whereas the collectors of the bipolar transistors 402a and 402b are connected at a connecting point R2. The connecting point R1 is connected via the DC cut capacitor 503a to an output terminal P3+, whereas the connecting point R2 is connected via the DC cut capacitor 503b to an output terminal P3−.

The emitters of the bipolar transistors 101a and 101b are connected to the inductors 201a and 201b, respectively, at one end of the inductors 201a and 201b. At the other end of the inductors 201a and 201b, the inductors 201a and 201b are connected to each other, and their connecting point Q1 is grounded. The capacitor 202a is inserted between the base and emitter of the bipolar transistor 101a, whereas the capacitor 202b is inserted between the base and emitter of the bipolar transistor 101b. The base of each of the bipolar transistors 101a and 101b is supplied with a base current from the bias circuit 104. The base of each of the bipolar transistors 102a and 102b is supplied with a base current from the bias circuit 105. The base of each of the bipolar transistors 401a, 401b, 402a, and 402b is supplied with a base current from the bias circuit 403.

The resistance 301a and the capacitor 302a are connected to each other in parallel so as to form a parallel circuit. This parallel circuit and the DC cut capacitor 303a are inserted in series between the base of the bipolar transistor 101a and the collector of the bipolar transistor 102a. The resistance 301b and the capacitor 302b are connected to each other in parallel so as to form a parallel circuit. This parallel circuit and the DC cut capacitor 303b are inserted in series between the base of the bipolar transistor 101b and the collector of the bipolar transistor 102b. The power voltage Vcc is supplied via the choke inductors 502a and 502b to the connecting points R1 and R2, respectively.

An input terminal P2+ is connected via the DC cut capacitor 504a to each of the bases of the bipolar transistors 401a and 402b. An input terminal P2− is connected via the DC cut capacitor 504b to each of the bases of the bipolar transistors 401b and 402a. The capacitor 404 is inserted between the connecting points R1 and R2 for reducing a leak of the second harmonic of a local signal to the output terminals P3+ and P3−.

Seventh Embodiment

Figure 9:
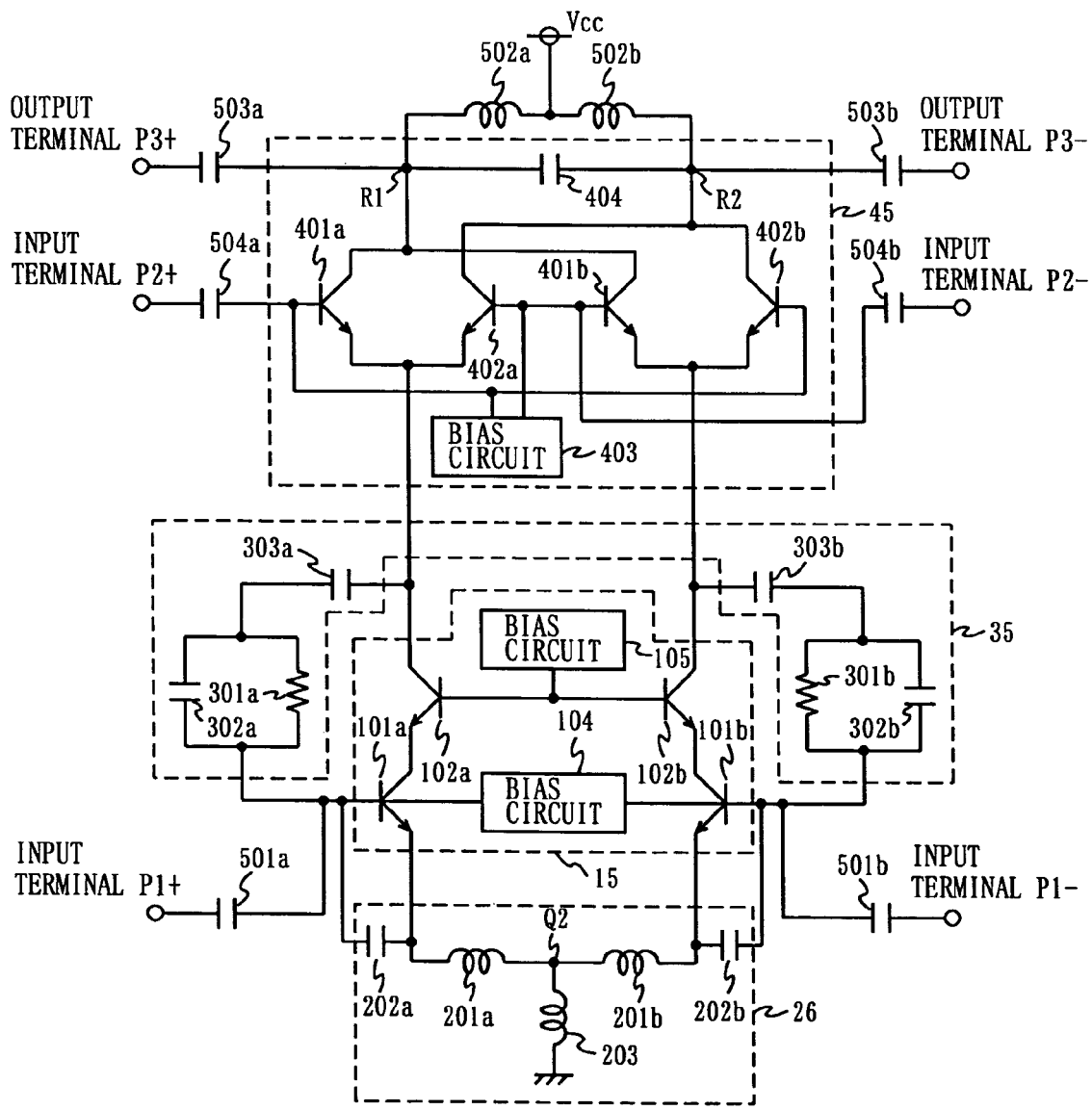
FIG. 9 is a circuit diagram of a frequency converter according to a seventh embodiment of the present invention.

FIG. 9 is a circuit diagram of a frequency converter according to a seventh embodiment of the present invention. The frequency converter as illustrated in FIG. 9 is similar to that according to the sixth embodiment, except that the first feedback circuit 25 is replaced by a first feedback circuit 26.

The structure and effect of the frequency converter as illustrated in FIG. 9 are evident from the above descriptions of the amplifier according to the first and third embodiments and the frequency converter according to the fifth and sixth embodiments, and therefore are not described herein.

According to the frequency converter of the present embodiment, with the inductor 203 being provided, a high-frequency negative feedback frequency converter having a wide dynamic range can be achieved with more flexibility than that of the frequency converter of the sixth embodiment with a simple structure.

Eighth Embodiment

Figure 10:
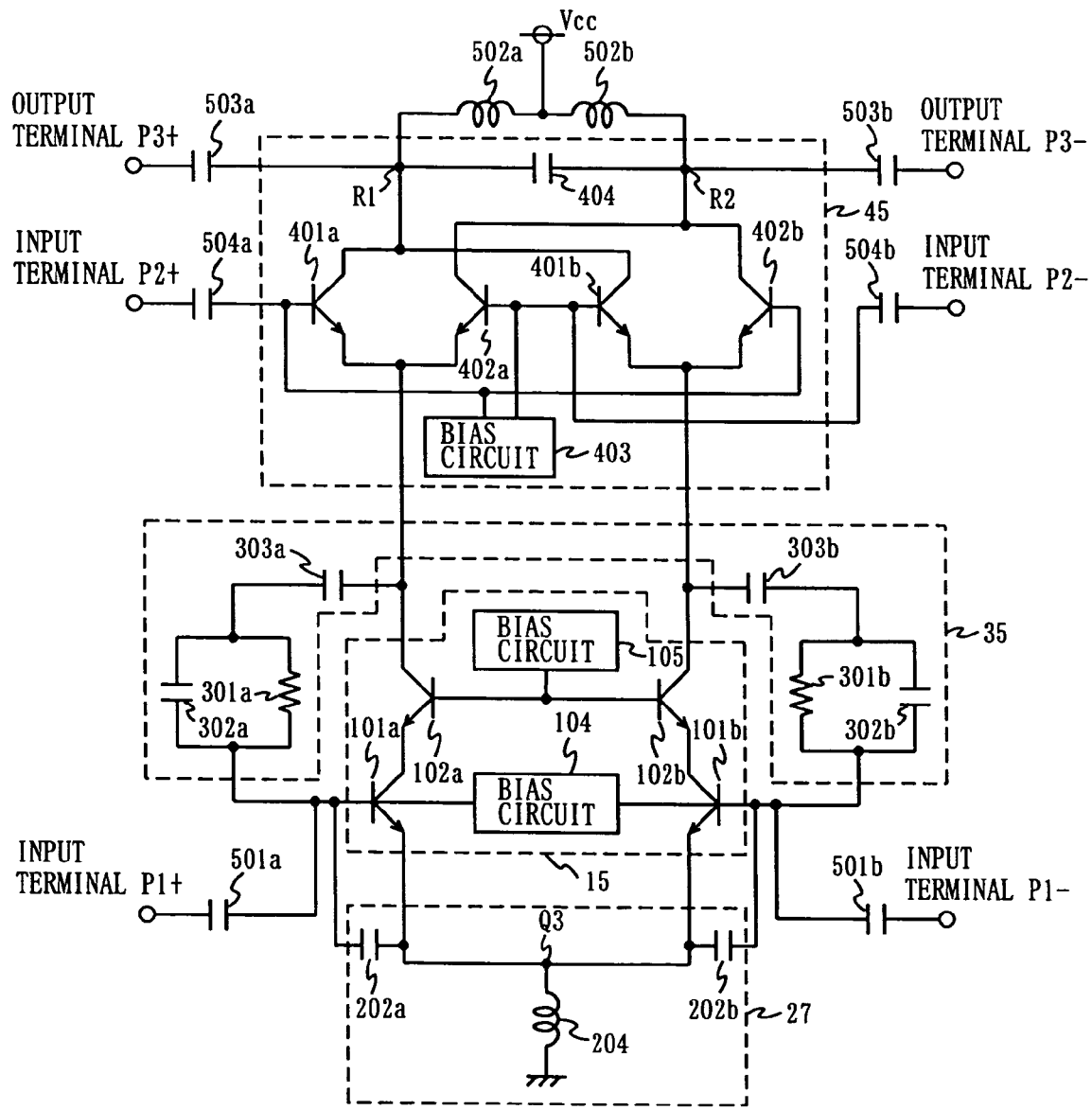
FIG. 10 is a circuit diagram of a frequency converter according to an eighth embodiment of the present invention.

FIG. 10 is a circuit diagram of a frequency converter according to an eighth embodiment of the present invention. The frequency converter as illustrated in FIG. 10 is similar to that according to the sixth embodiment, except that the first feedback circuit 25 is replaced by a first feedback circuit 27.

The structure and effect of the frequency converter as illustrated in FIG. 10 are evident from the above descriptions of the amplifier according to the first and fourth embodiments and the frequency converter according to the fifth and sixth embodiments, and therefore are not described herein.

According to the frequency converter of the present embodiment, with the inductors 201a and 201b not being provided, a high-frequency negative feedback frequency converter having a wide dynamic range can be achieved while the differential circuits of the differential amplifier circuit keep forming a good pair.

Modifications of Embodiments

Exemplary modifications of the amplifiers according to the first through fourth embodiments and the frequency converters according to the fifth through eighth embodiments are described below. The amplifiers and the frequency converters described below have effects similar to those of the amplifiers and frequency converters that have been described above.

Figure 11A:
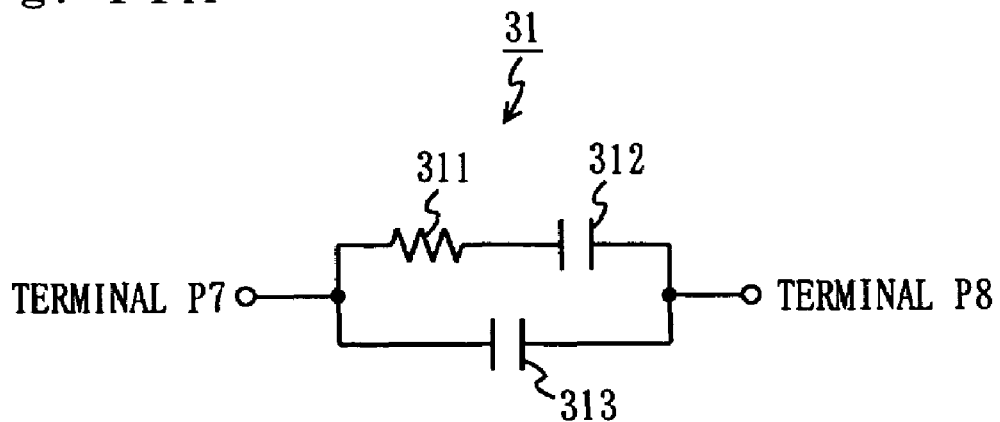
FIGS. 11A through 11C are other circuit diagrams of a second feedback circuit according to the first to eighth embodiments of the present invention.
Figure 11B:
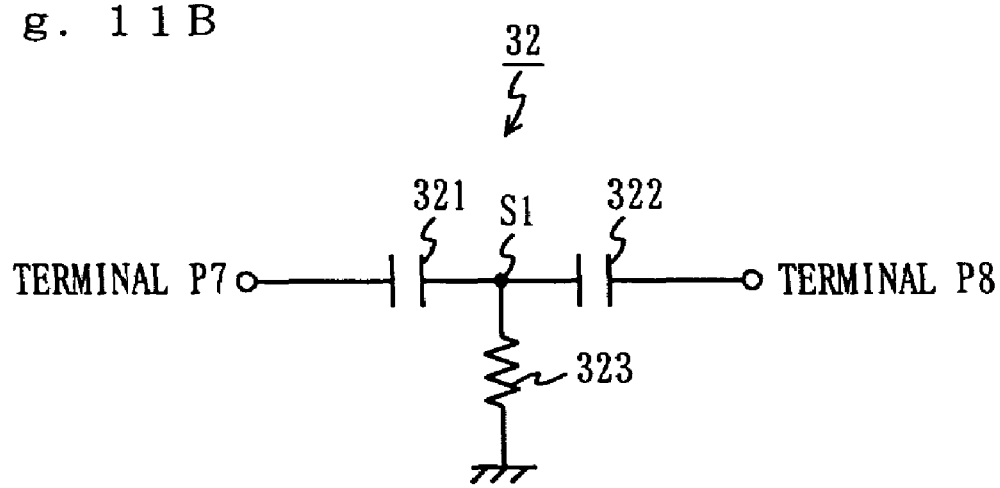
Figure 11C:
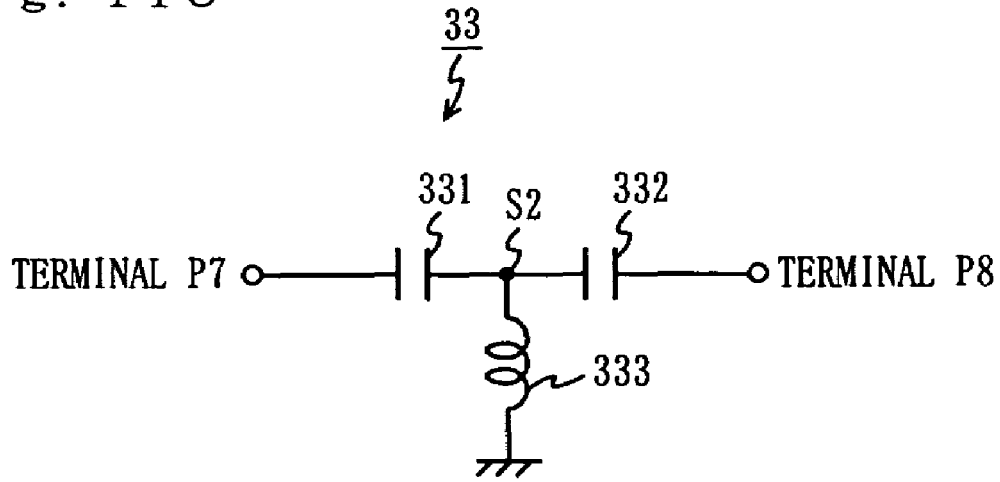

First, each of the second feedback circuit 30 and 35 as shown in each embodiment can be replaced by another feedback circuit. For example, such a feedback circuit can be formed by using any of three circuits as illustrated in FIGS. 11A through 11C. A circuit 31 as illustrated in FIG. 1A includes a resistance 311 and capacitors 312 and 313. The resistance 311 and the capacitor 312 are connected to each other in series to form a series circuit, to which the capacitor 313 is connected in parallel. A circuit 32 as illustrated in FIG. 11B includes capacitors 321 and 322, and a resistance 323. The capacitors 321 and 322 are connected to each other in series, and their connecting point S1 is grounded via the resistance 323. A circuit 33 as illustrated in FIG. 11C includes capacitors 331 and 332, and an inductor 333. The capacitors 331 and 332 are connected in series, and their connecting point S2 is grounded via the inductor 333.

Consider a case where the feedback circuit as illustrated in FIG. 11A is used to form the amplifier according to the first embodiment. In this case, a terminal P7 is connected to the base of the bipolar transistor 101, whereas a terminal P8 is connected to the collector of the bipolar transistor 102. The same goes for cases in which any of the feedback circuits as illustrated in FIGS. 11A through 11C is used to form the amplifier according to the embodiments other than the first embodiment. Note that the second feedback circuit 35, which is structured by a differential pair, can be formed by using a pair of two circuits, both identical to one of three circuits as illustrated in FIGS. 11A through 11C.

Figure 12:
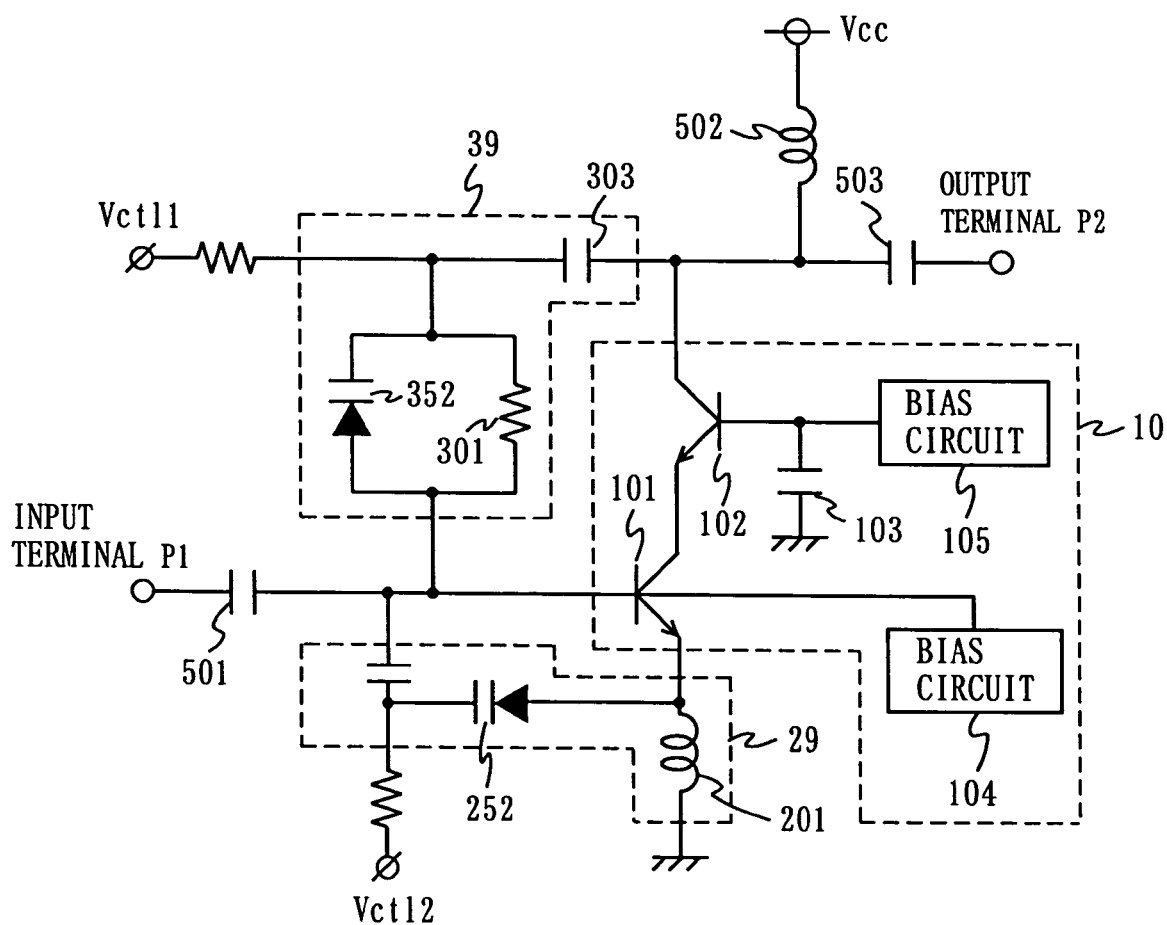
FIG. 12 is a circuit diagram of an amplifier according to a variant of the first embodiment of the present invention.

Also, in the feedback circuit as illustrated in each embodiment, a feedback signal may vary in amplitude and phase depending on, for instance, a level of an input signal. For example, a variable-capacitance diode (see FIG. 12) may be replaced by the capacitor in the feedback circuit. In the amplifier as illustrated in FIG. 12, a first feedback circuit 29 includes a variable-capacitance diode 252, whereas a second feedback circuit 39 includes a variable-capacitance diode 352. Voltages of impedance control signals Vct11 and Vct12 change with a level of an input signal, for example. A change in the voltage of the impedance control signal Vct11 causes the capacitance value of the variable-capacitance diode 352 to change, whereas a change in the voltage of the impedance control signal Vct12 causes the capacitance value of the variable-capacitance diode 252 to change. As a result, a feedback signal varies in amplitude and phase. With this, it is possible to control the amplifier circuit so that high gain and low IIP3 ($3^{rd}$ Input Intercept Point) are achieved when an input power is small, and control the amplifier circuit so that low gain and high IIP3 are achieved when an input power is large.

Figure 13:
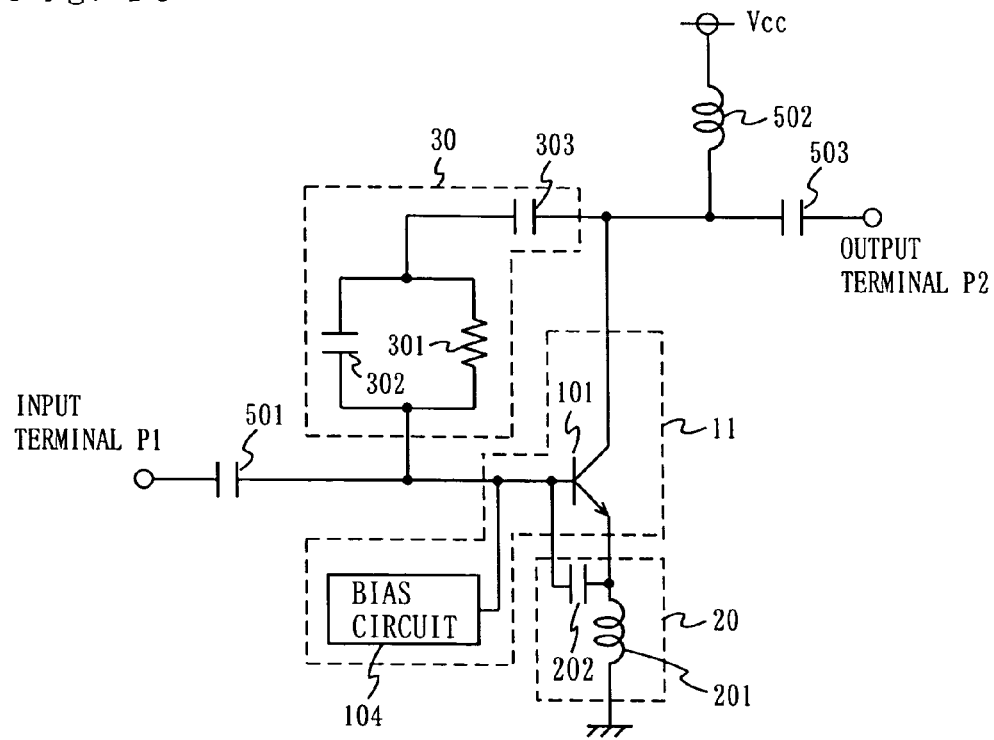
FIG. 13 is another circuit diagram of the amplifier according to the variant of the first embodiment of the present invention.

Also, instead of the cascode amplifier circuit 10 or 15 in each embodiment, an amplifier circuit having another structure can be used. For example, a single-type amplifier circuit (see FIG. 13) can be used. In an amplifier as illustrated in FIG. 13, an amplifier circuit 11 includes a bipolar transistor 101 and a bias circuit 104. The collector of the bipolar transistor 101 is connected via the DC cut capacitor 503 to the output terminal P2. Other than the structure of the amplifier circuit as mentioned above, the amplifier of FIG. 13 is similar to that according to the first embodiment. With the use of such a single-type amplifier circuit, an amplifier having low noise characteristics can be achieved. The above same effects can be also achieved by applying a single-type amplifier circuit to the amplifiers and the frequency converters of other embodiments.

Furthermore, the bipolar transistors as shown in each embodiment can be replaced by heterojunction bipolar transistors made of SiGe/Si, AlGaAs/GaAs, or GaInP/GaAs. Thus, it is possible to achieve an amplifier and a frequency converter having low noise and low distortion characteristics in high frequencies. Also, the bipolar transistors can be replaced by MOSFETs. Thus, with the use of low-cost CMOS process, it is possible to manufacture the amplifiers and the frequency converters according to the embodiments at low cost. Note that such replaceable bipolar transistors are those provided with reference numerals of 101 and 102 as shown in FIG. 1, 101a, 101b, 102a, and 102b as shown in FIGS. 3, 4, and 6, 101, 102, 401, and 402 as shown in FIG. 7, and 101a, 101b, 102a, 102b, 401a, 401b, 402a, and 402b as shown in FIGS. 8, 9, and 10.

Still further, in the above embodiments, the first feedback circuits 20, 25, 26, and 27 are implemented by inductors and capacitors. Alternatively, instead of the inductor, a circuit in which the inductor and the capacitor are connected to each other in parallel can be used. With this, a phase control over the fundamental wave and the second harmonic can be more flexibly performed. Note that such replaceable inductors are those provided with reference numerals of 201 as shown in FIGS. 1 and 7, 201a and 201b as shown in FIGS. 3 and 8, 201a, 201b, and 203 as shown in FIGS. 4 and 9, and 204 as shown in FIGS. 6 and 10.

In the above embodiments, it is preferable to implement the resistances by polysilicon, the capacitors by MOS capacitors or MIM (Metal Insulator Metal) capacitors, and the inductors by wiring layers of aluminum, copper, or gold. With this, the amplifiers and the frequency converters according to the above embodiments can be easily integrated into a semiconductor integrated circuit. Note that such resistances preferably implemented by polysilicon are those provided with reference numerals of 301 in FIGS. 1 and 7, and 301a and 301b in FIGS. 3, 4, 6, 8, 9, and 10. Also, such capacitors preferably implemented by MOS capacitors or the like are those provided with reference numerals of 103, 202, 302, and 303 in FIG. 1, 202a, 202b, 302a, 302b, 303a, and 303b in FIGS. 3, 4, and 6, 103, 202, 302, 303, and 404 in FIG. 7, and 202a, 202b, 302a, 302b, 303a, 303b, and 404 in FIGS. 8, 9, and 10. Furthermore, such inductors preferably implemented by wiring layers are those provided with reference numerals of 201 in FIGS. 1 and 7, 201a and 201b in FIGS. 3 and 8, 201a, 201b, and 202 in FIGS. 4 and 9, and 204 in FIGS. 6 and 10.

Still further, the phase of the feedback signal in the amplifiers and the frequency converters according to the above embodiments is influenced by an impedance of the signal source side seen from the device and an impedance of the load side seen from the device. Therefore, when a matching circuit is used at the input or output of the amplifiers and the frequency converters according to the above embodiments, the first and second feedback circuits have to be designed in consideration of the impedance of the matching circuit, so that a phase difference between the input signal and the feedback signal of each of the fundamental wave and the second harmonic is 180 degrees.

As described in the foregoing, according to the amplifiers of the first through fourth embodiments, the frequency converters of the fifth through eighth embodiments, and the exemplary modifications of the above embodiments, the passing phase of the first feedback circuit and the passing phase of the second feedback circuit are both adjusted. With this adjustment, the fundamental wave, the third-order intermodulation wave, and the second harmonic of the input signal can be negatively fed back to the input on the whole amplifier and frequency converter. Therefore, it is possible to achieve a high-frequency negative feedback amplifier and a high-frequency negative feedback frequency converter each having a wide dynamic range with a simple structure.

Ninth Embodiment

Figure 14:
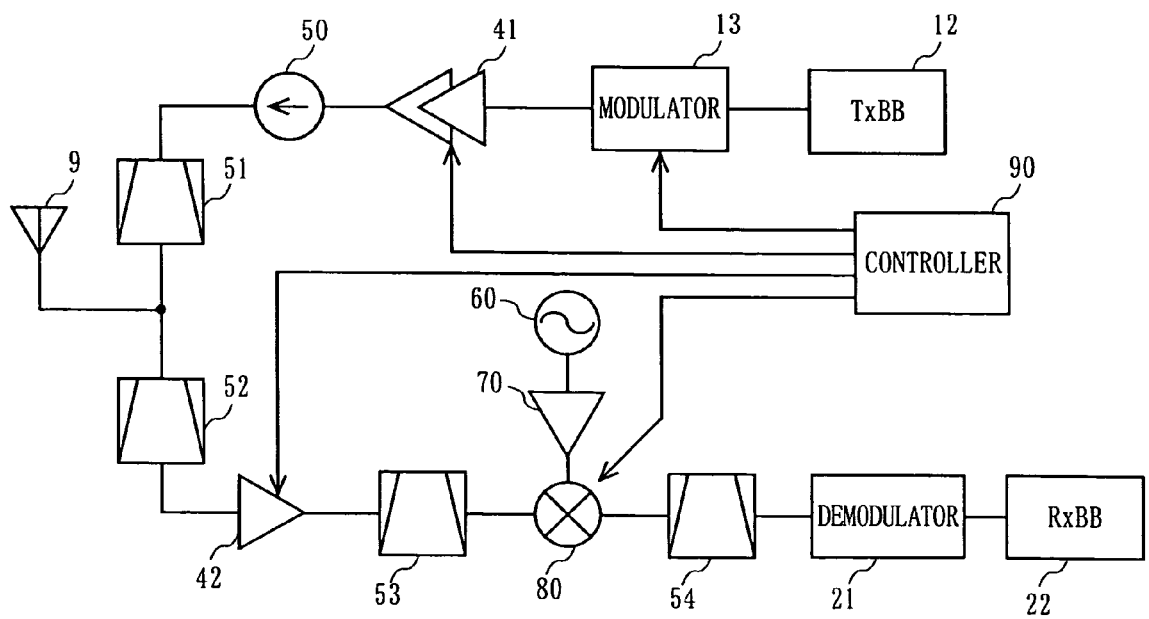
FIG. 14 is an illustration showing a structure of a wireless terminal according to a ninth embodiment of the present invention.
Figure 15:
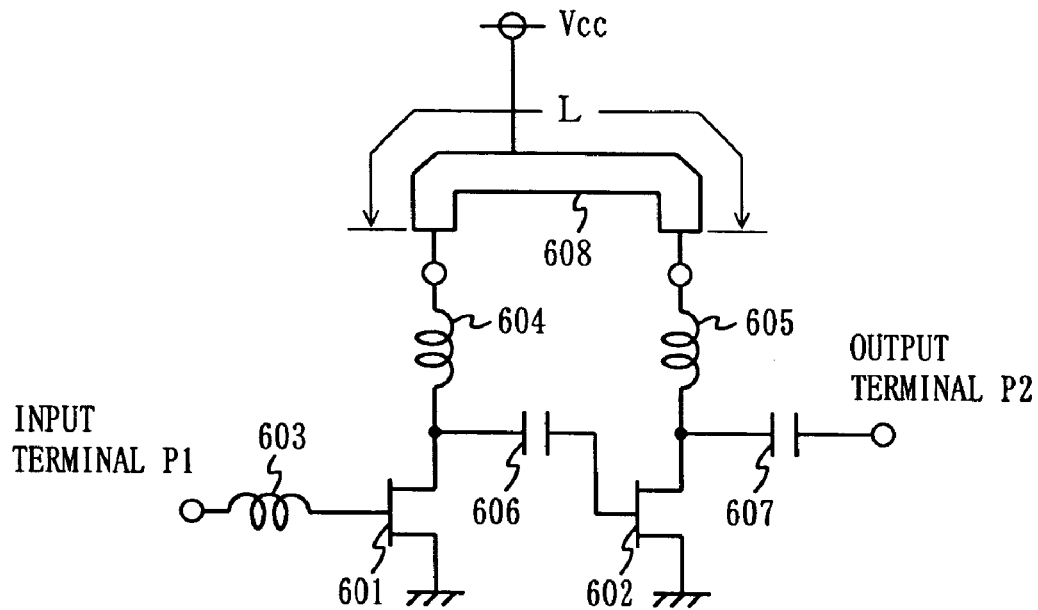
FIG. 15 is an illustration showing a first conventional negative feedback amplifier.
Figure 16:
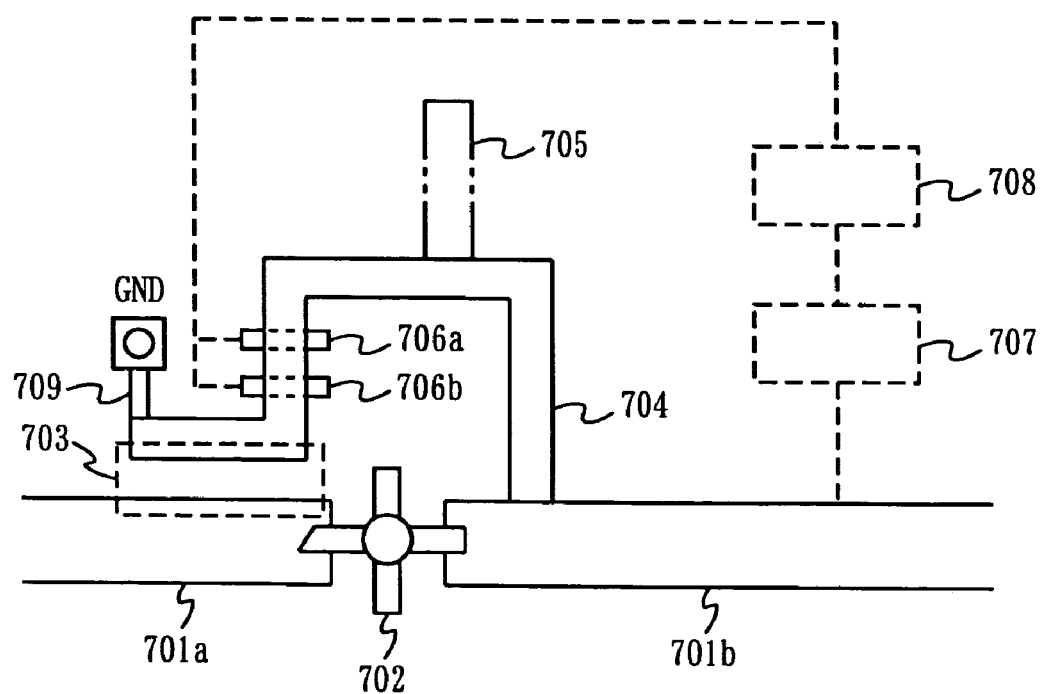
FIG. 16 is an illustration showing a second conventional negative feedback amplifier.
Figure 17:
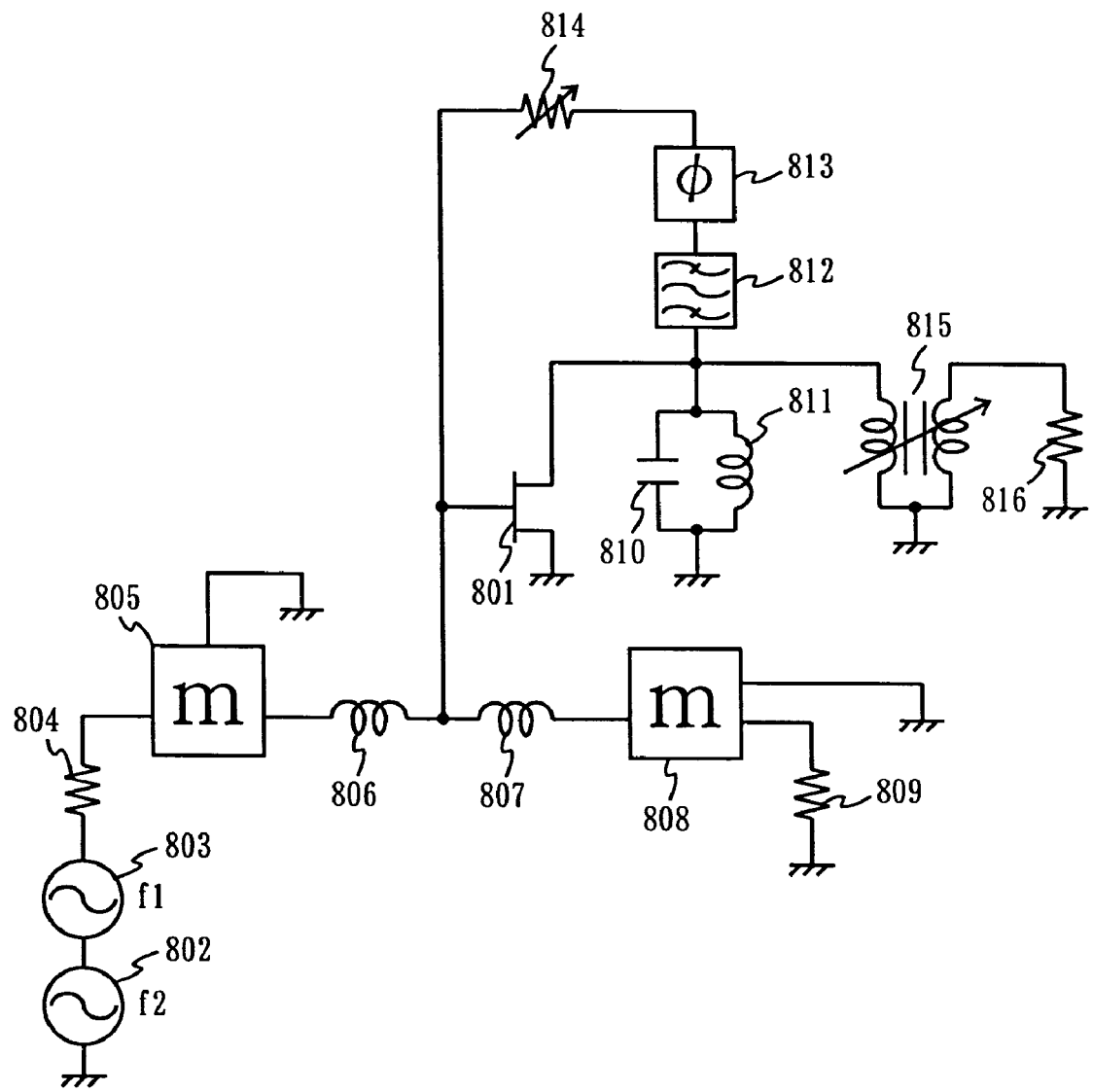
FIG. 17 is an illustration showing a third conventional negative feedback amplifier.
Figure 18:
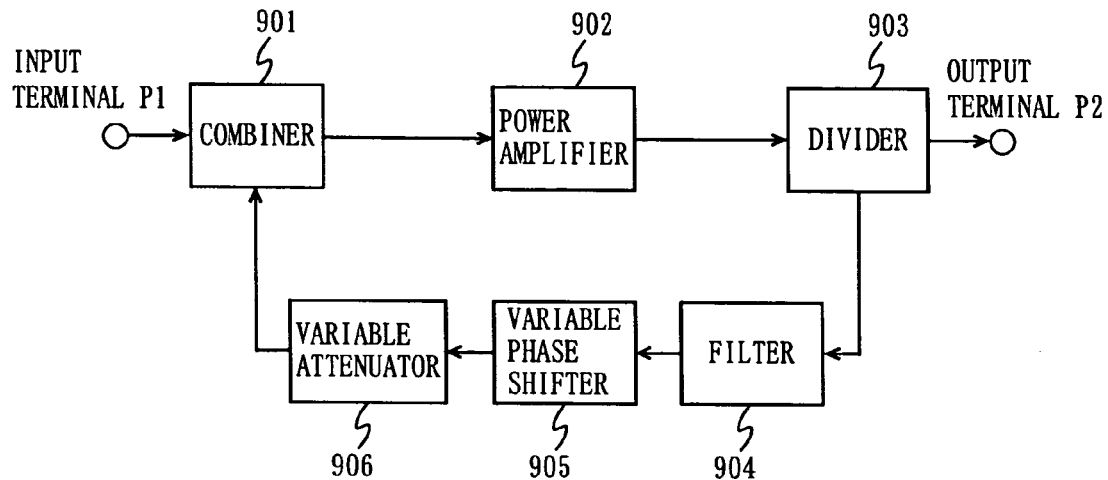
FIG. 18 is an illustration showing a fourth conventional negative feedback amplifier.
Figure 19:
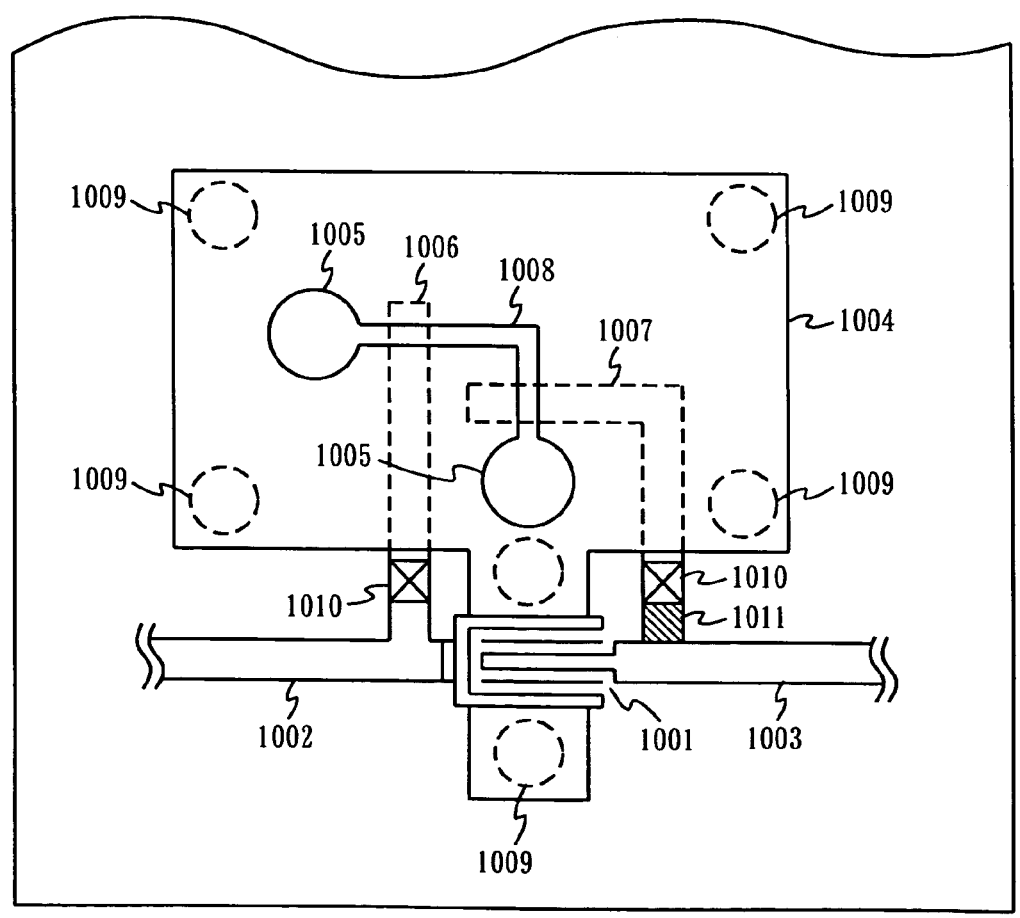
FIG. 19 is an illustration showing a fifth conventional negative feedback amplifier.
Figure 20:
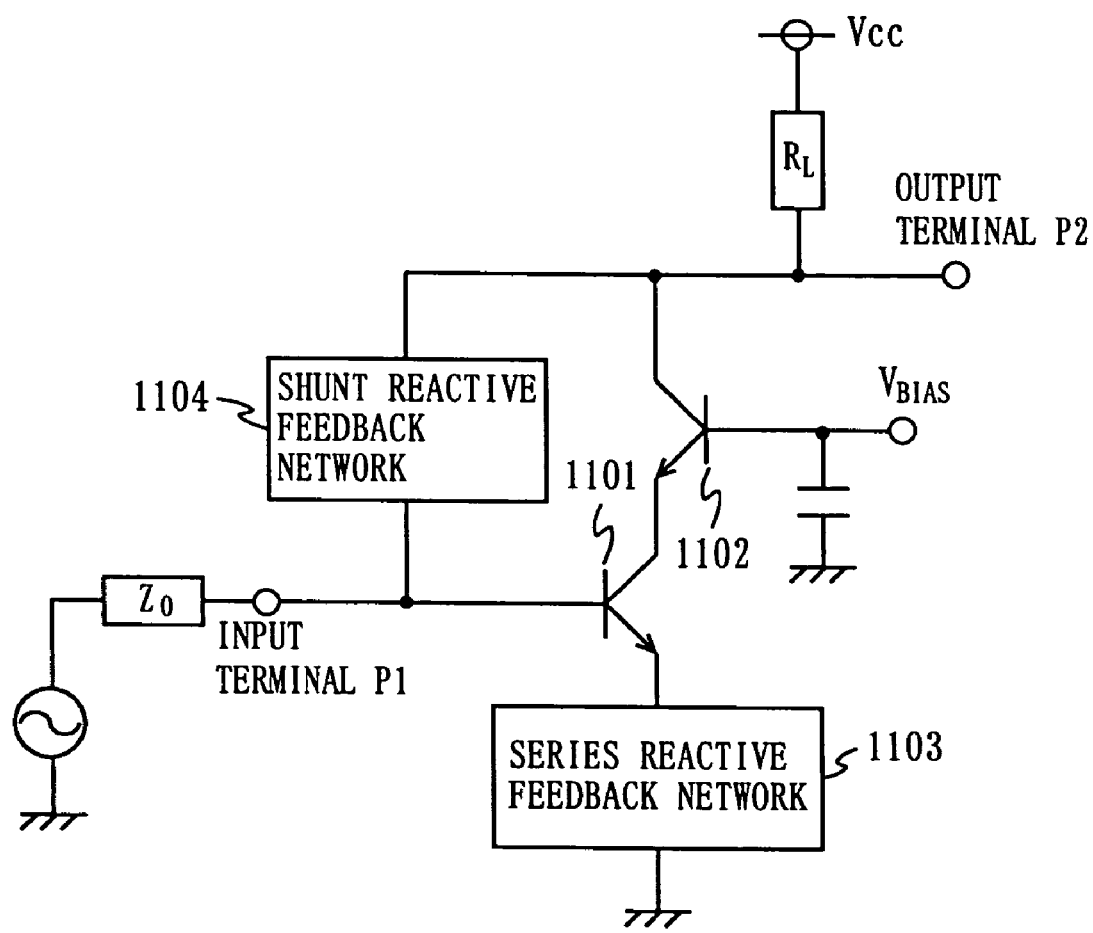
FIG. 20 is an illustration showing a sixth conventional negative feedback amplifier.

FIG. 14 is an illustration showing a structure of a wireless terminal according to a ninth embodiment of the present invention. In a wireless terminal performing transmission and reception simultaneously, a portion of a transmission signal generated by a transmission circuit is leaked to a reception circuit when transmission is performed. At the time of transmission, an amplifier and a frequency converter included in the reception circuit are required to have a very wide dynamic range. On the other hand, when no transmission is performed, the amplifier and the frequency converter included in the reception circuit are required to consume a small current.

Thus, as the amplifier and the frequency converter included in the reception circuit, the wireless terminal according to the present embodiment includes an amplifier 42 according to the first to fourth embodiments and the modifications thereof and a frequency converter 80 according to the fifth to eighth embodiments and the modifications thereof. Also, the wireless terminal includes a control section 90 for changing consumption current in the amplifier 42 and the frequency converter 80.

When a transmission start signal is received from a transmission baseband circuit 12, the control section 90 turns a modulator 13 and an amplifier 41 ON. As a result, the level of a leakage signal leaked from the transmission circuit to the reception circuit is increased. Thus, the control section 90 performs control so as to increase the consumption current in the amplifier 42 and the frequency converter 80 when the transmission start signal is received from the transmission baseband circuit 12.

The amplifier 42 and the frequency converter 80 are a negative feedback amplifier and a negative feedback frequency converter, respectively. Thus, even if the consumption current is increased, the gains of the amplifier 42 and the frequency converter 80 are not significantly increased. As a result, it is possible to realize a wireless terminal having a wide dynamic range without a major change in the level diagram structure of the wireless terminal.

Hereinafter, the detailed structure of the wireless terminal as shown in FIG. 14 will be described. In FIG. 14, the transmission baseband circuit 12, the modulator 13, the amplifier 41, an isolator 50, and a filter 51 comprise the transmission circuit, and filters 52 to 54, amplifiers 42 and 70, a signal generator 60, the frequency converter 80, a demodulator 21, and a reception baseband circuit 22 comprise the reception circuit. A leakage signal leaked from the transmission circuit to the reception circuit becomes an interfering signal for the reception circuit. Also, the transmission baseband circuit 12 functions as a transmission signal generation section, and the control section 90 functions as an interfering signal determination section and a control section.

The transmission baseband circuit 12 generates a transmission signal, and the modulator 13 modulates the transmission signal outputted from the transmission baseband circuit 12. The demodulator 21 demodulates a reception signal outputted from the filter 54, and the reception baseband circuit 22 performs a predetermined process for the reception signal outputted from the demodulator 21. The amplifiers 41, 42, and 70 amplify an input signal, and the filters 51 to 54 perform filtering of an input signal. The isolator 50 passes a signal in one direction. The signal generator 60 generates a signal having a predetermined frequency. The frequency converter 80 mixes two input signals. The antenna 9 performs transmission and reception of electric waves.

As described above, when a transmission start signal is received from the transmission baseband circuit 12, the control section 90 turns the modulator 13 and the amplifier 410N, and performs control so as to increase the consumption current in the amplifier 42 and the frequency converter 80. For example, the control section 90 performs control so as to increase a bias voltage of the bias circuit included in the amplifier as shown in FIG. 1, or increase a bias voltage of the bias circuit included in the frequency converter as shown in FIG. 7. Thus, the consumption current in the amplifier 42 and the frequency converter 80 is increased, and the level of distortion of the amplifier 42 and the frequency converter 80 is increased. As such, when the level of a leakage signal leaked from the transmission circuit to the reception circuit is high, the consumption current in the amplifier 42 and the frequency converter 80 is controlled so as to be high.

Hereinafter, a wireless receiver and a wireless reception method of the present invention will be described by describing an operation of the wireless terminal as shown in FIG. 14. Hereinafter, to facilitate understanding of the description, the operation of the wireless terminal will be divided into three parts: transmission, reception, and control. Note that, in actuality, these three parts are executed simultaneously.

(1) Transmission

The transmission baseband circuit 12 generates a transmission signal, and outputs the transmission signal to the modulator 13. The modulator 13 modulates the transmission signal outputted from the transmission baseband circuit 12, and outputs the modulated signal to the amplifier 41. The amplifier 41 amplifies the transmission signal outputted from the modulator 13, and outputs the amplified signal to the isolator 50. The isolator 50 outputs the transmission signal outputted from the amplifier 41 to the filter 51, and prohibits a reflected signal from the filter 51 from being inputted to the amplifier 41. The filter 51 performs filtering of the transmission signal outputted from the isolator 50, and outputs the resultant signal to the antenna 9. The antenna 9 transmits the transmission signal outputted from the filter 51 using wireless waves.

(2) Reception

The antenna 9 receives a reception signal using wireless waves, and outputs the reception signal to the filter 52. The filter 52 performs filtering of the reception signal outputted from the antenna 9, and outputs the resultant signal to the amplifier 42. The amplifier 42 amplifies the reception signal outputted from the filter 52, and outputs the amplified signal to the filter 53. The filter 53 performs filtering of the reception signal outputted from the amplifier 42, and outputs the resultant signal to the frequency converter 80. The frequency converter 80 mixes the reception signal outputted from the filter 53 and a local signal (a signal generated by the signal generator 60 and amplified by the amplifier 70), and outputs the resultant signal to the filter 54. The filter 54 performs filtering of the reception signal outputted from the frequency converter 80, and outputs the resultant signal to the demodulator 21. The demodulator 21 demodulates the reception signal outputted from the filter 54, and outputs the demodulated signal to the reception baseband circuit 22. The reception baseband circuit 22 performs a predetermined process for the reception signal outputted from the demodulator 21.

(3) Control

When a transmission start signal is received from the transmission baseband circuit 12, the control section 90 turns the modulator 13 and the amplifier 41 ON, and performs control so as to increase the consumption current in the amplifier 42 and the frequency converter 80. Also, when a transmission termination signal is received from the transmission baseband circuit 12, the control section 90 turns the modulator 13 and the amplifier 41 OFF, and performs control so as to reduce the consumption current in the amplifier 42 and the frequency converter 80. Thus, the consumption current in the amplifier 42 and the frequency converter 80 is controlled so as to be increased when the level of a leakage signal leaked from the transmission circuit to the reception circuit is high.

As described above, according to the wireless terminal of present embodiment, even if a communication scheme performing transmission and reception simultaneously (e.g., W-CDMA scheme) is adopted, it is possible to widen a dynamic range of the amplifier and the frequency converter while minimizing the increase in the consumption current. As such, it is possible to concurrently achieve a wide dynamic range and reduced consumption current.

The amplifier and the frequency converter of the present invention each have a wide dynamic range with a simple structure. Therefore, the amplifier and the frequency converter of the present invention can be used as various types of amplifiers and frequency converters such as receivers of a wireless communication system.

While the invention has been described in detail, the foregoing description is in all aspects illustrative and not restrictive. It is understood that numerous other modifications and variations can be devised without departing from the scope of the invention.

What is claimed is:

1. An amplifier for amplifying differential signal composed of an in-phase signal and an opposite-phase signal, said amplifier comprising:
   an amplifier circuit, connected to a path from an input terminal to an output terminal, for amplifying the differential signal inputted from the input terminal;
   a first feedback circuit, which is connected between an input and a feedback terminal of said amplifier circuit and which includes an inductor and a capacitor, for feeding a feedback output of said amplifier circuit back to the input of said amplifier circuit while changing, in one direction, a phase of the signal passing through said first feedback circuit; and
   a second feedback circuit, which is connected between the input and an output of said amplifier circuit and which includes a circuit in which a resistor and a capacitor are connected in parallel, for feeding the output of said amplifier circuit back to the input of said amplifier circuit while changing, in another direction, a phase of the signal passing through said second feedback circuit,
   wherein said amplifier circuit includes:
      an in-phase amplifying section, having an in-phase feedback terminal which is one of phase feedback terminals, for operating based on the in-phase signal of the differential signal; and
      an opposite-phase amplifying section, having an opposite-phase feedback terminal which is another of the phase feedback terminals, for operating based on the opposite-phase signal of the differential signal,
   wherein one end of said first feedback circuit is electrically connected to both the in-phase feedback terminal and the opposite-phase feedback terminal, and another end of said first feedback circuit is grounded,
   wherein said second feedback circuit includes:
      an in-phase feedback section operating based on the in-phase signal; and
      an opposite-phase feedback section operating based on the opposite-phase signal; and
   wherein a phase of a signal in which fundamental waves included in two feedback signals fed back by said first and second feedback circuits are combined is shifted by approximately 180 degrees from a phase of a fundamental wave of the signal inputted from the input terminal.

2. The amplifier according to claim 1, wherein each of said in-phase amplifying section and said opposite-phase amplifying section includes:
   a first bipolar transistor having a base and an emitter, the base being connected to the input of said amplifying section and the emitter being connected to either the in-phase feedback terminal or the opposite-phase feedback terminal; and
   a second bipolar transistor having an emitter being connected to a collector of said first bipolar transistor and having a collector being connected to the output of said amplifying section.

3. The amplifier according to claim 1, wherein each of said in-phase amplifying section and said opposite-phase amplifying section includes a bipolar transistor having a base, an emitter, and a collector, the base being connected to the input of said amplifying section, the emitter being connected to either said in-phase feedback terminal or said opposite-phase feedback terminal, and the collector being connected to the output of said amplifying section.

4. The amplifier according to claim 1, wherein a frequency converter circuit for converting a frequency of a signal having been amplified by said amplifier circuit is connected to the output of said amplifier circuit.

5. A wireless receiver comprising:
   said amplifier according to claim 1 for amplifying a reception signal received by an antenna;
   a frequency converter for converting a frequency of an output of said amplifier;
   an interfering signal determination section for making a determination on an interfering signal for the reception signal; and
   a control section for changing consumption current in said amplifier and said frequency converter based on a determination result in said interfering signal determination section.

6. The wireless receiver according to claim 5, wherein said control section is operable to increase consumption current in said amplifier and said frequency converter when said interfering signal determination section determines that a level of the interfering signal is high.

7. The wireless receiver according to claim 6, further comprising a transmission signal generation section for generating a transmission signal to be transmitted from the antenna, wherein said interfering signal determination section is operable to make the determination based on whether or not the transmission signal is generated by said transmission signal generation section.

* * * * *

UNITED STATES PATENT AND TRADEMARK OFFICE
CERTIFICATE OF CORRECTION

| | | |
|---|---|---|
| PATENT NO. | : 7,298,205 B2 | Page 1 of 1 |
| APPLICATION NO. | : 10/945987 | |
| DATED | : November 20, 2007 | |
| INVENTOR(S) | : Toshifumi Nakatani et al. | |

It is certified that error appears in the above-identified patent and that said Letters Patent is hereby corrected as shown below:

Title Page
Insert Item (30), Foreign Application Priority Date
--Sept. 24, 2003    (JP)  ................... 2003-332555--.

IN THE CLAIMS
In column 22, claim 1, line 22, "signal; and" should read --signal, and--.

Signed and Sealed this

Twenty-seventh Day of May, 2008

JON W. DUDAS
*Director of the United States Patent and Trademark Office*